(12) United States Patent
Takekoshi

(10) Patent No.: US 11,342,157 B2
(45) Date of Patent: May 24, 2022

(54) CHARGED PARTICLE BEAM INSPECTION APPARATUS AND CHARGED PARTICLE BEAM INSPECTION METHOD

(71) Applicant: NuFlare Technology, Inc., Yokohama (JP)

(72) Inventor: Hidekazu Takekoshi, Fujisawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 17/126,802

(22) Filed: Dec. 18, 2020

(65) Prior Publication Data
US 2021/0202206 A1    Jul. 1, 2021

(30) Foreign Application Priority Data

Dec. 27, 2019 (JP) .............................. JP2019-238575
Nov. 24, 2020 (JP) .............................. JP2020-194644

(51) Int. Cl.
*H01J 37/244* (2006.01)
*H01J 37/20* (2006.01)
(Continued)

(52) U.S. Cl.
CPC ........ *H01J 37/244* (2013.01); *H01J 37/1474* (2013.01); *H01J 37/20* (2013.01);
(Continued)

(58) Field of Classification Search
CPC .. H01J 37/00; H01J 37/02; H01J 37/26; H01J 37/28; H01J 37/244; H01J 37/20; H01J 37/1474; H01J 37/265; H01J 37/1471; H01J 37/222; H01J 2237/20285; H01J 2237/2448; H01J 2237/2817; G01N 21/9501
(Continued)

(56) References Cited

U.S. PATENT DOCUMENTS

2018/0031498 A1 * 2/2018 Shiratsuchi ............. H01J 37/22
2019/0360951 A1   11/2019 Ogawa
2021/0217582 A1 * 7/2021 Maassen ................ H01J 37/28

FOREIGN PATENT DOCUMENTS

JP   2018-017571 A   2/2018
JP   2019-203761 A   11/2019

* cited by examiner

*Primary Examiner* — Jason L McCormack
(74) *Attorney, Agent, or Firm* — Oblon, McClelland, Maier & Neustadt, L.L.P.

(57) ABSTRACT

A charged particle beam inspection apparatus includes a movable stage, configured to hold a substrate placed on the movable stage; a stage control circuit, configured to continuously move the movable stage in a direction opposite to a first direction; a deflection control circuit, configured to control a deflector to collectively deflect multiple beams to an N×N' small region group including N small regions, the collective deflection includes performing tracking deflection of the multiple beams and collectively deflecting the multiple beams to a new group of N×N' small regions and sequentially perform a first and a second step, a detector configured to detect secondary electrons emitted from the substrate due to irradiation of the substrate with the multiple beams, and combinations of a value of N and a value of M are set such that the greatest common divisor of the value of N and the value of M is 1.

20 Claims, 23 Drawing Sheets

(51) Int. Cl.
*H01J 37/28* (2006.01)
*H01J 37/147* (2006.01)
(52) U.S. Cl.
CPC ..... *H01J 37/28* (2013.01); *H01J 2237/20285* (2013.01); *H01J 2237/2448* (2013.01)
(58) Field of Classification Search
USPC .......................................... 250/306, 307, 311
See application file for complete search history.

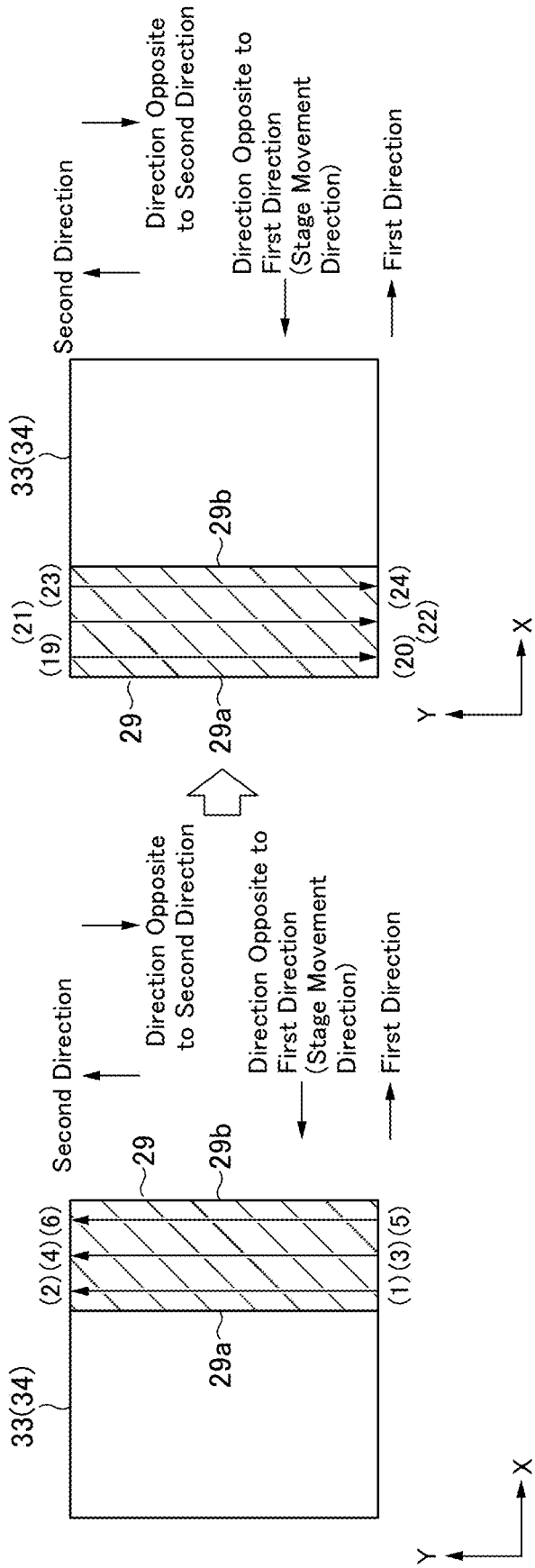

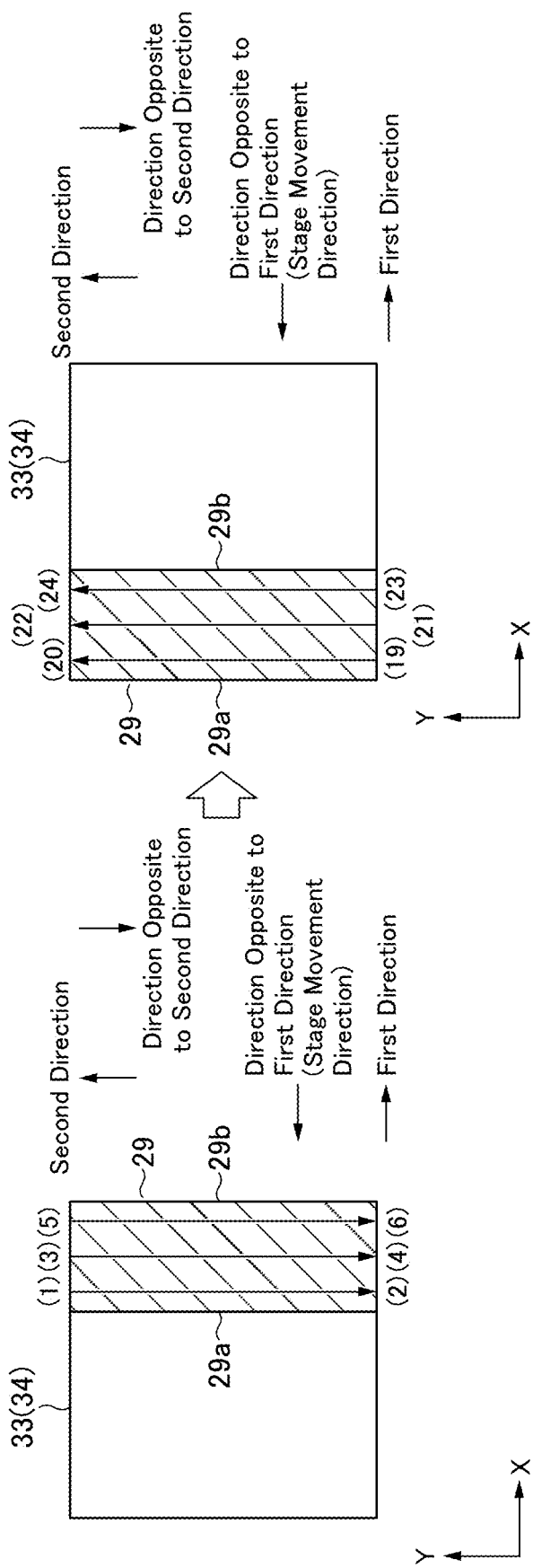

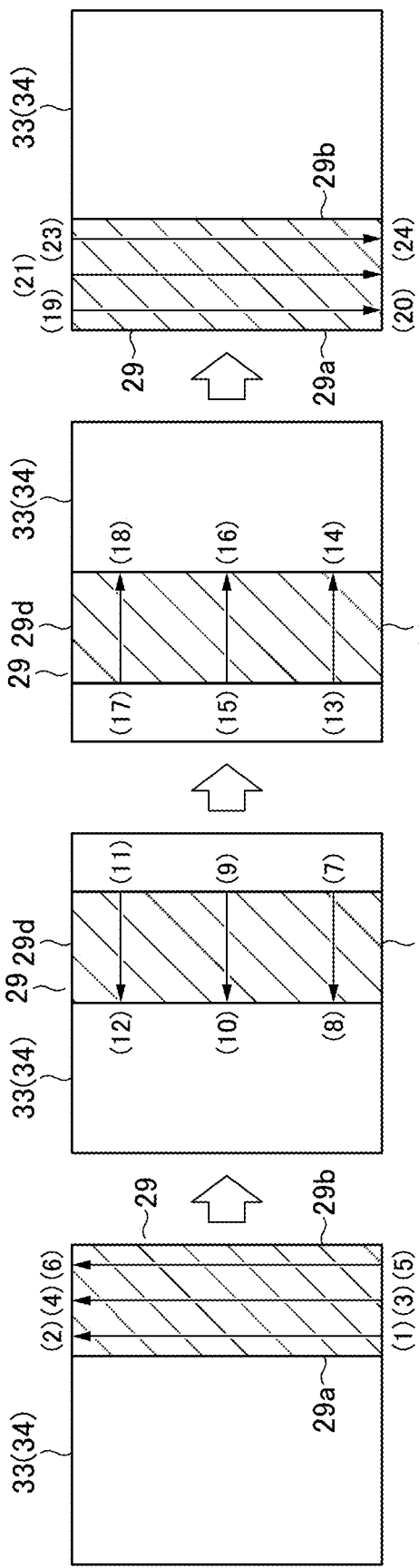

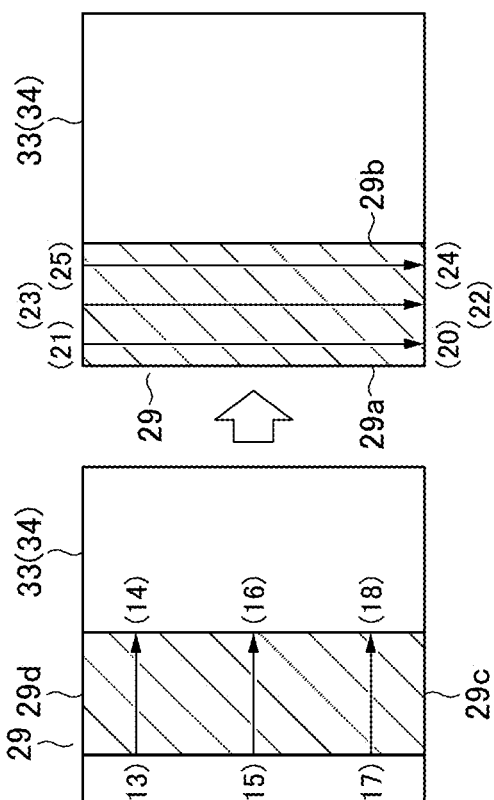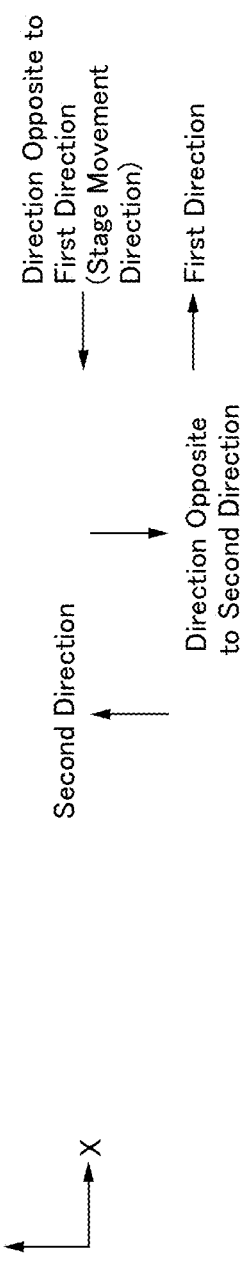

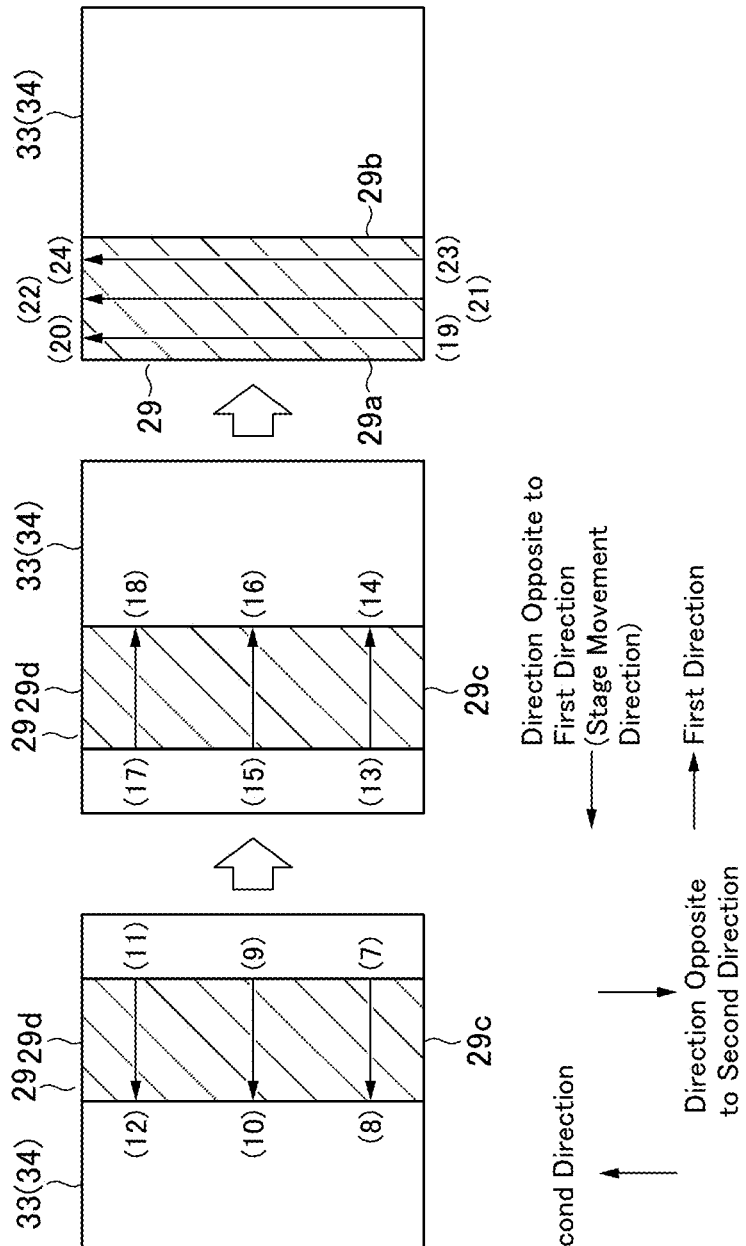

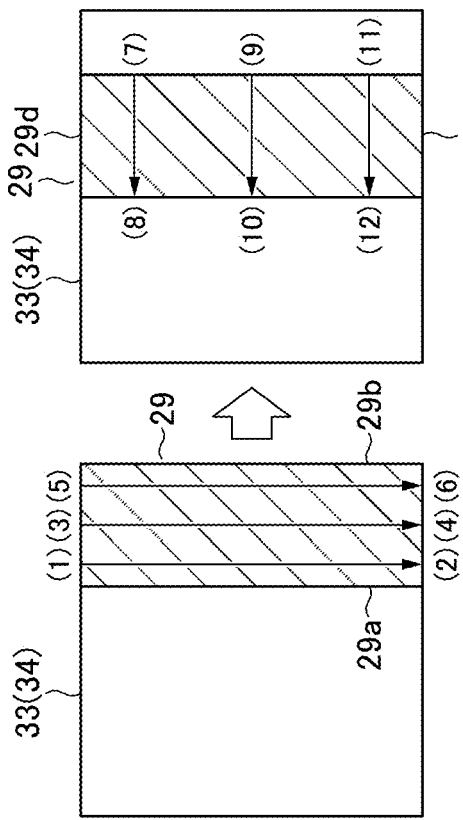

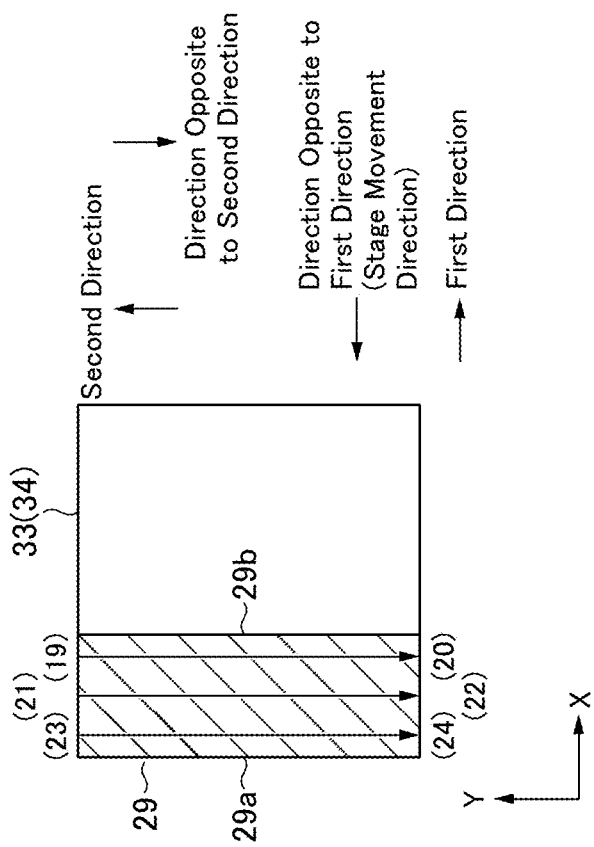
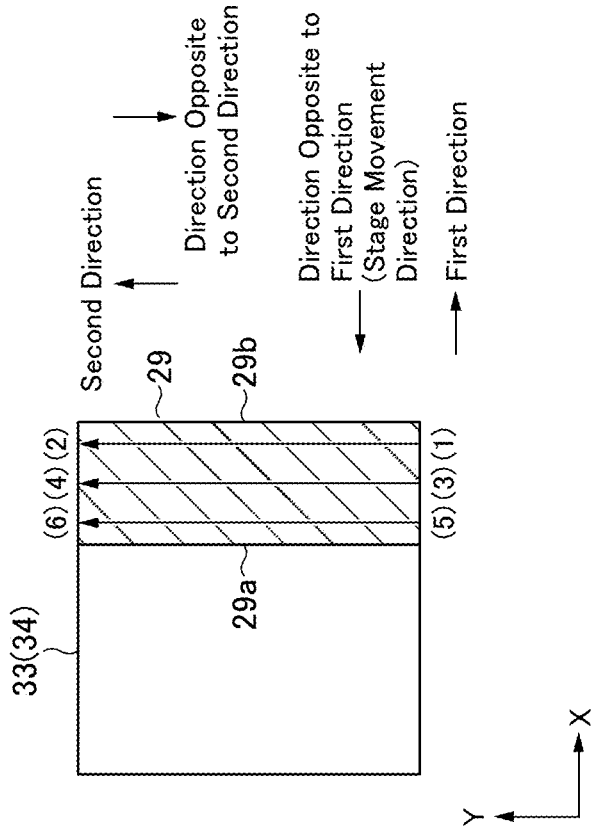

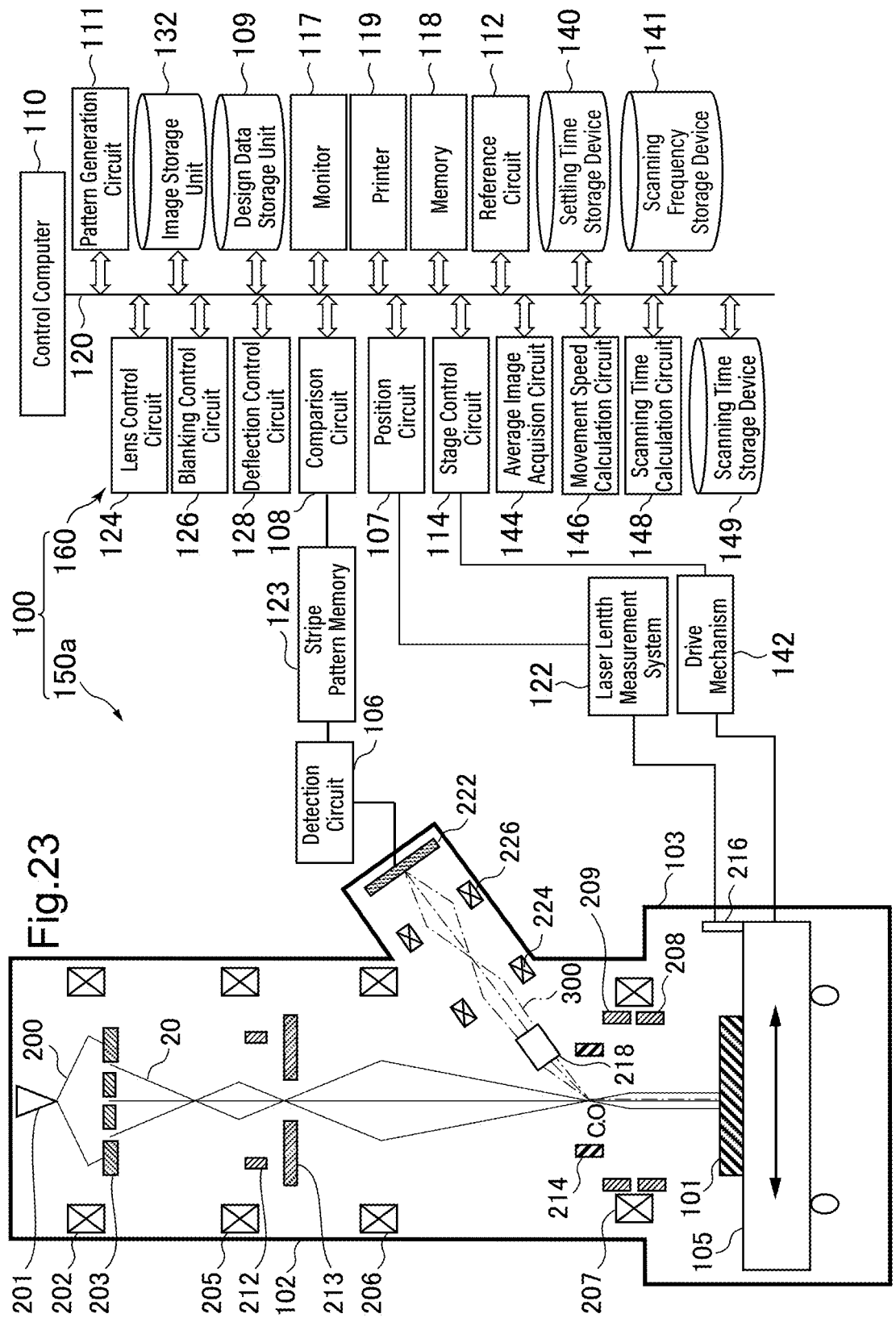

CHARGED PARTICLE BEAM INSPECTION APPARATUS AND CHARGED PARTICLE BEAM INSPECTION METHOD

CROSS-REFERENCE TO RELATED APPLICATION

This application is based upon and claims the benefit of priority from Japanese Patent Applications No. 2019-238575, filed on Dec. 27, 2019, and Japanese Patent Applications No. 2020-194644, filed on Nov. 24, 2020, the entire contents of which are incorporated herein by reference.

FIELD OF THE INVENTION

The present application relates to a charged particle beam inspection apparatus and a charged particle beam inspection method. For example, the application relates to an inspection apparatus that acquires a secondary electron image of a pattern emitted by irradiation with multiple beams composed of electron beams and inspects the pattern.

In recent years, a circuit line width required for semiconductor elements has been reduced with an increase in the degree of integration and capacity of large-scale integrated circuits (LSIs). These semiconductor elements are manufactured by exposing and transferring a pattern to a wafer with a reduced projection exposure apparatus called a stepper, using an original image pattern (also referred to as a mask or a reticle; hereinafter, generically referred to as a mask), on which a circuit pattern is formed, to form circuits.

Further, improvement in yield is indispensable in manufacturing an LSI that requires a large manufacturing cost. However, a processing size of less than 20 nm has already been achieved by liquid immersion exposure and multi-patterning technology. In addition, microfabrication below 10 nm has been achieved by the practical use of extreme ultraviolet (EUV) exposure. Further, microfabrication techniques other than the techniques using an exposure machine, such as nano-imprinting lithography (NIL) and directed self-assembly (DSA) lithography, have been put to practical use. In recent years, with the miniaturization of the size of LSI patterns formed on semiconductor wafers, the size of an object that needs be detected as a pattern defect has become extremely small and the number of patterns that need to be inspected in the same area has become extremely large. Therefore, it is necessary to increase the accuracy and processing speed of the inspection apparatus that inspects the defects of the ultrafine patterns transferred onto the semiconductor wafer. In addition, one of the major factors that reduce the yield is a pattern defect of the mask used when an ultrafine pattern is exposed and transferred onto the semiconductor wafer by a photolithography technique. Therefore, it is necessary to increase the accuracy of the inspection apparatus that inspects the defects of a transfer mask used for LSI manufacturing.

As an inspection method, a method has been known which performs inspection by comparing an optical image obtained by capturing an image of a pattern formed on an inspection target object, for example, a wafer, such as a semiconductor wafer, or a mask, such as a lithography mask, at a predetermined magnification using an enlargement optical system with design data or an optical image obtained by capturing an image of the same pattern on the inspection target object. For example, the following are used as the inspection method: a "die-to-die inspection method" that compares optical image data items obtained by capturing the images of the same pattern at different positions on the same mask; and a "die-to-database inspection" method that inputs writing data (design pattern data) converted into an apparatus input format that is input by a writing apparatus when pattern-designed CAD data is written as a pattern on a mask to an inspection apparatus, generates design image data (reference image) on the basis of the writing data, and compares the design image data with an optical image which is measurement data obtained by capturing an image of the pattern. In the inspection method in the inspection apparatus, inspection is performed by placing an inspection target substrate on a stage (target object stage) and scanning an inspection target object with a light beam while moving the stage. The inspection target substrate is irradiated with the light beam by a light source and an illumination optical system. An image is formed on a sensor by light transmitted through or reflected from the inspection target substrate through the optical system. The image captured by the sensor is transmitted as measurement data to a comparison circuit. The comparison circuit aligns the images, compares the measurement data and reference data according to an appropriate algorithm, and determines that there is a pattern defect in a case in which the measurement data and the reference data are not matched with each other.

In the above-mentioned pattern inspection apparatus, the optical image is acquired by irradiating the inspection target substrate with laser light and capturing a transmission image or a reflection image of the substrate. In contrast, an inspection apparatus has been developed which irradiates an inspection target substrate with multiple beams composed of a plurality of electron beams arranged in an array in which a plurality of beam rows are arranged at the same pitch on a straight line, detects secondary electrons corresponding to each beam emitted from the inspection target substrate, and acquires a pattern image. The pattern inspection apparatus using the electron beams including the multiple beams scans each small region of the inspection target substrate to detect the secondary electrons. At that time, a so-called step-and-repeat operation is performed which fixes the position of the inspection target substrate during beam scanning and moves the position of the inspection target substrate to the next small region after the scanning ends. The use of the multiple beams arranged in the array in which a plurality of beam rows are arranged at the same pitch on a straight line makes it possible to dispose a large number of beams in a limited region and thus to simultaneously scan a large number of small regions at a time. Therefore, throughput is expected to be improved. However, the step-and-repeat operation requires a settling time (overhead time) until the position of the stage is stabilized whenever the stage is moved. Since the range of one scanning operation (small region) is narrow, the number of steps of the stage significantly increases in order to scan the entire substrate. Therefore, wasted time that is not required for scanning is generated by the time obtained by multiplying the number of steps by the settling time. Even in a case in which the substrate is scanned with the multiple beams, it is estimated that the time required for operations other than scanning is 80 hours or more for one substrate.

Therefore, a technique which changes the stage movement method from the step-and-repeat operation method to a continuous movement method that does not require a settling time for each step has been examined in order to improve the throughput of the inspection apparatus. However, in a case in which scanning is performed with the multiple beams arranged in an array, the continuous movement method does not require the settling time. However, in the continuous movement method, since the same small region is sequentially sent within the scanning range of a plurality of beams arranged in the movement direction, unnecessary scanning is repeatedly performed for the small regions for which the pattern images have already been acquired. As a result, throughput is not improved. In order to prevent the unnecessary scanning from being repeated, it is necessary to skip the scanned small region and to scan the next small region. Therefore, it is necessary to increase the deflection width of the multiple beams. However, when the beam deflection width is increased, the influence of the aberration of the electron optics increases. As a result, it is difficult to sufficiently narrow each beam and so-called blurring occurs.

The following technique is disclosed as a technique for preventing the problems. That is, multiple beams which are composed of a plurality of charged particle beams arranged in N columns (N is an integer equal to or greater than 2) and N' rows (N' is an integer equal to or greater than 1) in a first direction and a second direction orthogonal to the first direction at the same pitch p on a surface of a substrate are collectively deflected to an N×N' divided small region group including N divided small regions arranged at the pitch p in the first direction and N' divided small regions arranged at the pitch p in the second direction on the substrate among a plurality of divided small regions which are obtained by dividing an inspection region of the substrate and each of which has a size of p/M (M is an integer equal to or greater than 2) in the first direction and a predetermined size in the second direction. While a stage is continuously moved in a direction opposite to the first direction by a distance of N/M·p, the tracking deflection of the multiple beams is performed so as to follow the continuous movement of the stage. Then, while the tracking deflection of the multiple beams is performed so as to follow the continuous movement of the stage, the multiple beams are collectively deflected so as to scan the N×N' divided small region group.

According to the above-mentioned technique, it is possible to reduce the beam deflection width in the first direction. Therefore, it is possible to reduce the influence of the aberration of the electron optics.

Here, the pattern image becomes white or black due to the charging of the inspection target object according to the type of inspection target object. Therefore, it may be difficult to determine whether or not there is a pattern defect. For this reason, for example, a technique is considered which scans the small regions (including divided small regions) on the inspection target object with multiple beams in different directions to acquire a plurality of pattern images and performs inspection using an image obtained by averaging the plurality of pattern images. It is possible to easily acquire the averaged image in a case in which the stage is not continuously moved. Next, a case is considered in which the stage movement method is the continuous movement method as described above. In this case, there is a problem that, when beam scanning is performed, unintended vibration is applied to the stage as the stage is continuously moved and a specific portion of the inspection target object protrudes from a beam scannable region. In addition, this problem is particularly serious in a case in which the beam scanning is performed at the edge of the small regions. Further, the unintended vibration applied to the stage is particularly likely to occur in the movement direction of the stage or in a direction opposite to the movement direction of the stage.

SUMMARY OF THE INVENTION

According to an aspect of the application, there is provided a charged particle beam inspection apparatus including: a movable stage, configured to hold a substrate placed on the movable stage; a stage control circuit, configured to continuously move the movable stage in a direction opposite to a first direction; a deflection control circuit, configured to control a deflector to collectively deflect multiple beams to an N×N' small region group including N small regions (N being an integer equal to or greater than 2) arranged at a pitch p in the first direction and N' small regions (N' being an integer equal to or greater than 1) arranged at the pitch p in a second direction orthogonal to the first direction on the substrate among a plurality of small regions obtained by dividing an inspection region of the substrate, each small region having a size of p/M (M being an integer equal to or greater than 2) in the first direction and a predetermined size in the second direction, the multiple beams being composed of a plurality of charged particle beams arranged in N columns and N' rows in the first direction and the second direction at the same pitch p on a surface of the substrate, the collective deflection including performing tracking deflection of the multiple beams so as to follow a continuous movement of the movable stage by a distance of N/M·p in the direction opposite to the first direction, and collectively deflecting the multiple beams to a new group of N×N' small regions arranged at the pitch p in the first direction to perform a tracking reset until the continuous movement of the movable stage by the distance of N/M·p in the direction opposite to the first direction is completed, the new N×N' small region group being located away from the N×N' small region group by N small regions in the first direction, and sequentially perform a first step and a second step in each of the small regions with each of the multiple beams while the tracking deflection of the multiple beams is performed so as to follow the continuous movement of the movable stage to collectively deflect the multiple beams so as to scan the N×N' small region group, the first step including repeating the collective deflection of the multiple beams along the second direction from an end of each of the small regions in the direction opposite to the first direction to an end of each of the small regions in the first direction, using the end of each of the small regions in the direction opposite to the first direction as a starting point and the end of each of the small regions in the first direction as an end point, and the second step including repeating the collective deflection of the multiple beams along a direction opposite to the second direction from the end of each of the small regions in the direction opposite to the first direction to the end of each of the small regions in the first direction, using the end of each of the small regions in the direction opposite to the first direction as a starting point and the end of each of the small regions in the first direction as an end point; and a detector configured to detect secondary electrons emitted from the substrate due to irradiation of the substrate with the multiple beams, wherein combinations of a value of N and a value of M are set such that the greatest common divisor of the value of N and the value of M is 1.

BRIEF DESCRIPTION OF THE DRAWINGS

FIGS. 9A and 9B are diagrams schematically illustrating an example of a scanning operation in a first aspect of Embodiment 1;

FIGS. 10A and 10B are diagrams schematically illustrating an example of the scanning operation in the first aspect of Embodiment 1;

FIGS. 11A to 11D are diagrams schematically illustrating an example of a scanning operation in a second aspect of Embodiment 1;

FIGS. 12A to 12D are diagrams schematically illustrating another example of the scanning operation in the second aspect of Embodiment 1;

FIGS. 13A to 13D are diagrams schematically illustrating another example of the scanning operation in the second aspect of Embodiment 1;

FIGS. 14A to 14D are diagrams schematically illustrating another example of the scanning operation in the second aspect of Embodiment 1;

FIGS. 16A and 16B are diagrams schematically illustrating an example of a scanning operation in another comparative example of Embodiment 1;

FIG. 23 is a diagram illustrating another configuration of the pattern inspection apparatus in Embodiment 1.

DETAILED DESCRIPTION OF THE EMBODIMENTS

Hereinafter, a case in which an electron beam is used as an example of a charged particle beam will be described in embodiments. However, the application is not limited thereto. Other charged particle beams, such as ion beams, may be used.

Embodiment 1

Figure 1:
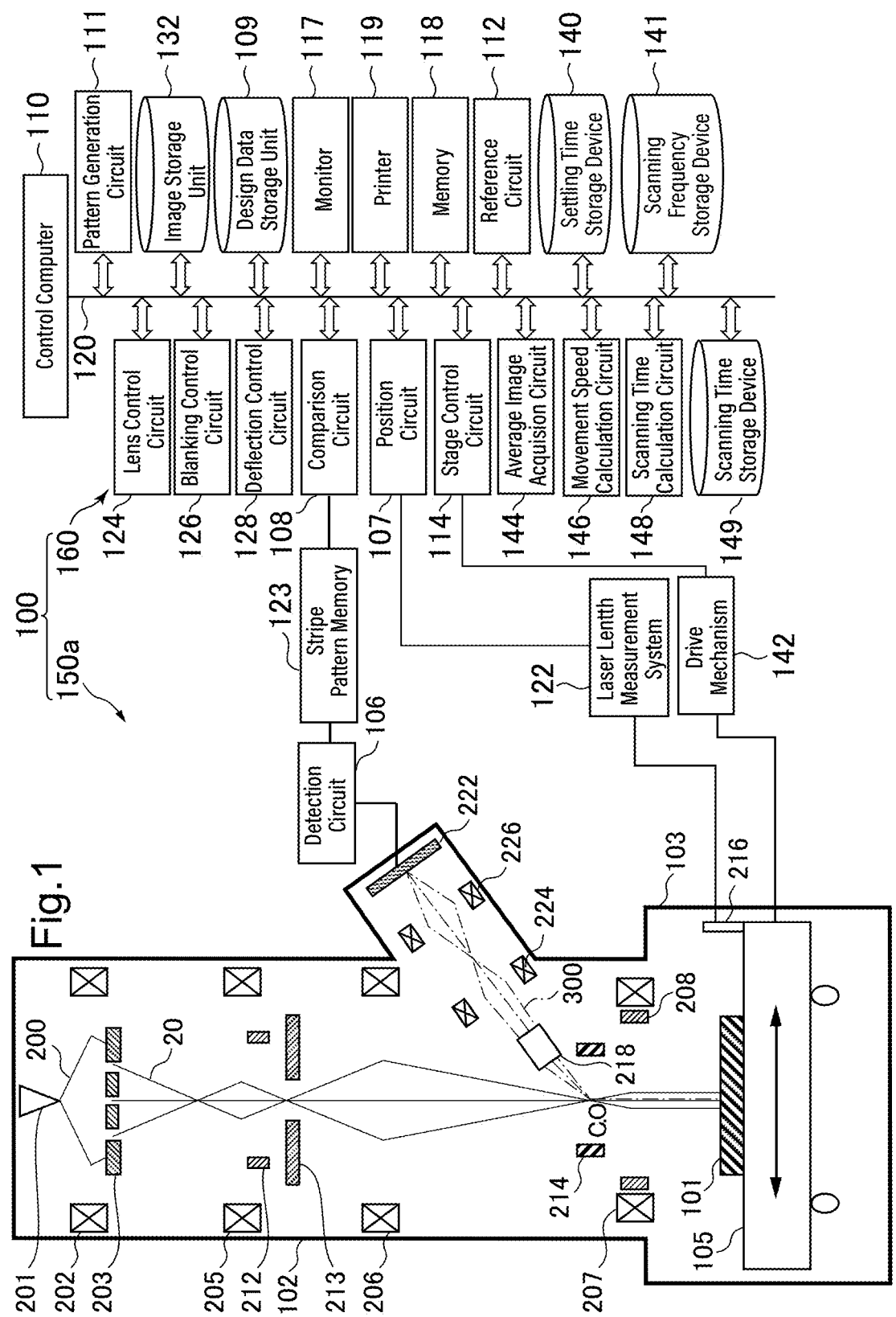
FIG. 1 is a diagram illustrating a configuration of a pattern inspection apparatus in Embodiment 1.

FIG. 1 is a diagram illustrating the configuration of a pattern inspection apparatus according to Embodiment 1. In FIG. 1, an inspection apparatus 100 that inspects a pattern formed on a substrate is an example of a charged particle beam inspection apparatus. The inspection apparatus 100 includes an electron optical image acquisition mechanism 150a and a control system circuit 160 (control unit). The electron optical image acquisition mechanism 150a includes an electron beam column 102 (electron optical column), an inspection chamber 103, a detection circuit 106, a stripe pattern memory 123, and a laser length measurement system 122. The electron beam column 102 is provided with an electron gun assembly (irradiation source) 201, an electromagnetic lens 202, a shaping aperture array substrate 203, a reducing lens 205, an electromagnetic lens 206, an electromagnetic lens (objective lens) 207, a deflector 208, a collective blanking deflector 212, a limiting aperture substrate 213, a beam separator 214, a deflector 218, electromagnetic lenses 224 and 226, and a multi-detector 222.

An XY stage (a target object stage and an example of a stage) 105 that can be moved at least on the XY plane is disposed in the inspection chamber 103. A substrate (inspection target object) 101 on which a chip pattern to be inspected is formed is disposed on the XY stage 105. The substrate 101 is, for example, a silicon wafer. For example, the substrate 101 is disposed on the XY stage 105 with a pattern formation surface facing upward. In addition, a mirror 216 that reflects laser light for laser length measurement emitted from the laser length measurement system 122 disposed outside the inspection chamber 103 is disposed on the XY stage 105. The multi-detector 222 is connected to the detection circuit 106 outside the electron beam column 102. The detection circuit 106 is connected to the stripe pattern memory 123.

In the control system circuit 160, a control computer 110 which is a computer is connected to a position circuit 107, a pattern generation circuit 111, a stage control circuit 114, a lens control circuit 124, a blanking control circuit 126, a deflection control circuit 128, an image storage device 132, a comparison circuit 108, a storage device 109, such as a magnetic disk device, a monitor 117, a memory 118, a printer 119, a reference circuit 112, a settling time storage device 140, a scanning frequency storage device 141, an average image acquisition circuit 144, a movement speed calculation circuit 146, a scanning time calculation circuit 148, and a scanning time storage device 149 through a bus 120. Further, the XY stage 105 is driven by a driving mechanism 142 under the control of the stage control circuit 114. In the driving mechanism 142, for example, a driving system, such as a three-axis (X-Y-θ) motor that drives in the X direction, the Y direction, and the θ direction is configured and the XY stage 105 is movable. For example, step motors can be used as an X motor, a Y motor, and a θ motor which are not illustrating. The XY stage 105 can be moved in the horizontal direction and the rotation direction by the motors of the X, Y, and θ axes. Then, the movement position of the XY stage 105 is measured by the laser length measurement system 122 and is supplied to the position circuit 107. The laser length measurement system 122 receives reflected light from the mirror 216 and measures the position of the XY stage 105 using the principle of laser interferometry.

A high-voltage power supply circuit (not illustrated) is connected to the electron gun assembly 201. An acceleration voltage is applied from the high-voltage power supply circuit between a filament (not illustrated) and an extraction electrode in the electron gun assembly 201. In addition, an electron group emitted from a cathode is accelerated by the application of a predetermined voltage to the extraction electrode and the heating of the cathode (filament) at a predetermined temperature and is emitted as an electron beam. The reducing lens 205 and the objective lens 207 are, for example, electromagnetic lenses and are controlled by the lens control circuit 124. The beam separator 214 is also controlled by the lens control circuit 124. The collective blanking deflector 212 is composed of an electrode group of at least two poles and is controlled by the blanking control circuit 126. The deflector 208 is composed of an electrode group of at least four poles and is controlled by the deflection control circuit 128.

In a case in which the substrate 101 is a semiconductor wafer on which a plurality of chip (die) patterns are formed, pattern data of the chip (die) patterns is input from the outside of the inspection apparatus 100 and is then stored in the storage device 109. In a case in which the substrate 101 is an exposure photomask, design pattern data that is a basis for forming a mask pattern on the exposure photomask is input from the outside of the inspection apparatus 100 and is then stored in the storage device 109.

Here, in FIG. 1, a configuration necessary for explaining the embodiment is illustrated. In general, the inspection apparatus 100 may have other necessary configurations.

Figure 2:
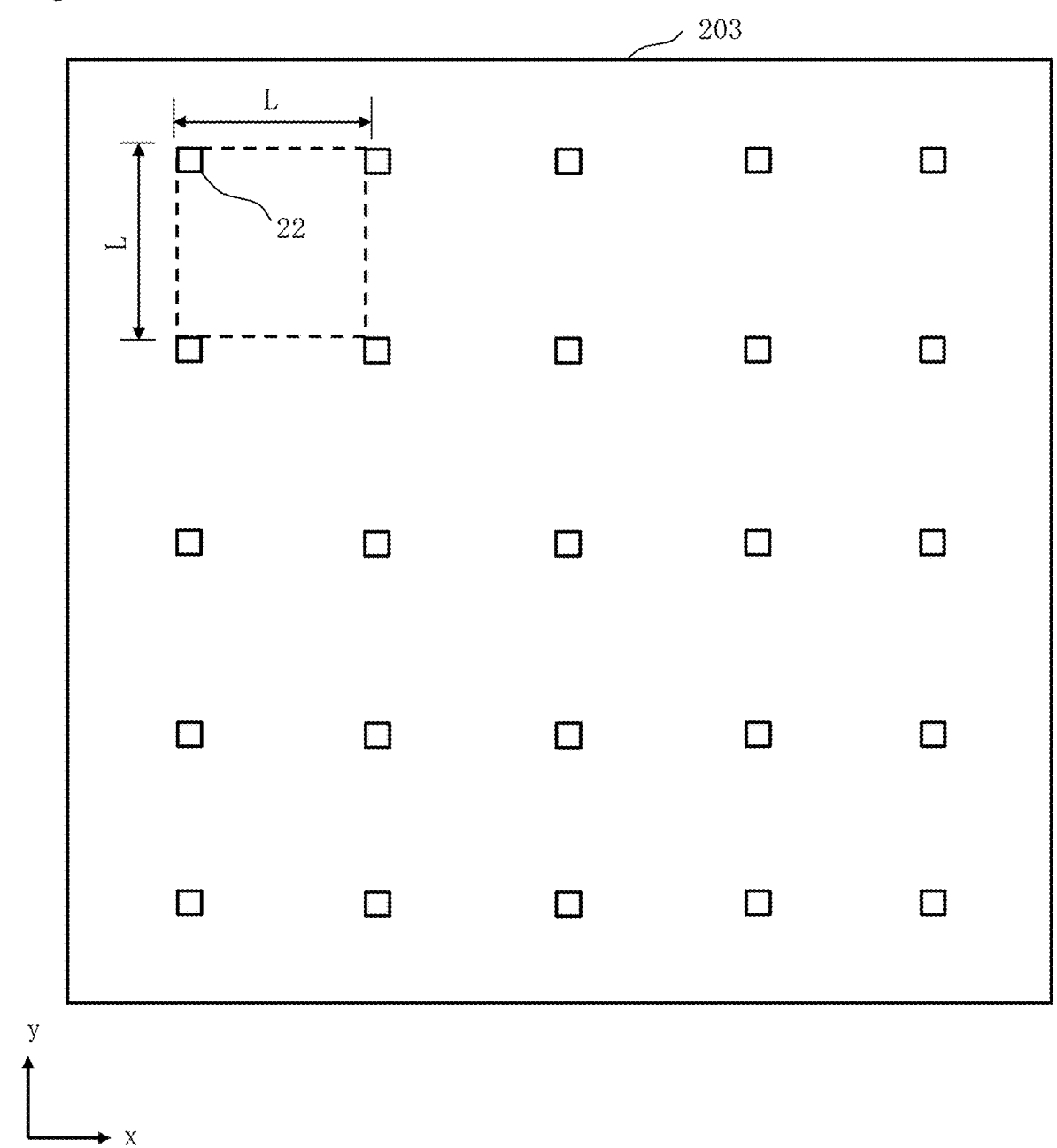
FIG. 2 is a conceptual diagram illustrating a configuration of a shaping aperture array member in Embodiment 1.

FIG. 2 is a conceptual diagram illustrating the configuration of a shaping aperture array member in Embodiment 1. In FIG. 2, in the shaping aperture array substrate 203, holes (opening portions) 22 having a two-dimensional matrix shape of N columns (N is an integer equal to or greater than 2) (x direction) and N' rows (N' is an integer equal to or greater than 1) (y direction) are formed at a predetermined array pitch L in the x direction and the y direction (x: a first direction, y: a second direction). In a case in which the reduction ratio of multiple beams is "a" (in a case in which the diameter of the multiple beams is reduced to 1/a and the substrate 101 is irradiated with the multiple beams) and the pitch between the multiple beams in the x direction and the y direction on the substrate 101 is "p", the array pitch L has a relationship of L=(a×p). In the example illustrated in FIG. 2, a case in which N×N' holes 22 (N=5 and N'=5) for forming multiple beams are formed is illustrated. Next, the operation of the electron optical image acquisition mechanism 150a in the inspection apparatus 100 will be described.

The entire shaping aperture array substrate 203 is substantially vertically illuminated with electron beams 200 emitted from the electron gun assembly 201 (emission source) by the electromagnetic lens 202. As illustrated in FIG. 2, a plurality of holes 22 (opening portions) are formed in the shaping aperture array substrate 203 and the electron beams 200 illuminate a region including all of the plurality of holes 22. Each of the electron beams 200 emitted to the positions of the plurality of holes 22 passes through each of the plurality of holes 22 of the shaping aperture array substrate 203 to form multiple primary electron beams (multiple beams) 20.

Each of the formed multiple beams 20 is deflected by the electromagnetic lens (reducing lens) 205 and the electromagnetic lens 206, passes through the beam separator 214 disposed at the crossover position of each of the multiple beams 20 while repeatedly forming an intermediate image and a crossover, and travels to the objective lens 207. Then, the objective lens 207 focuses the multiple beams 20 on the substrate 101. The multiple beams 20 focused on a surface of the substrate 101 (target object) by the objective lens 207 are collectively deflected by the deflector 208 and are emitted to each irradiation position of each beam on the substrate 101. In addition, in a case in which all of the multiple beams 20 are collectively deflected by the collective blanking deflector 212, the position deviates from a central hole of the limiting aperture substrate 213 and the multiple beams 20 are shielded by the limiting aperture substrate 213. In contrast, the multiple beams 20 that are not deflected by the collective blanking deflector 212 pass through the central hole of the limiting aperture substrate 213 as illustrated in FIG. 1. The collective blanking deflector 212 is turned on and off to perform blanking control, and the turn-on and turn-off of the beams are collectively controlled. As such, the limiting aperture substrate 213 shields the multiple beams 20 that have been deflected by the collective blanking deflector 212 such that the beams are turned off. Then, the multiple beams 20 for inspection (for image acquisition) are formed by a beam group that has been formed for the period from the turn-on of the beams to the turn-off of the beams and has passed through the limiting aperture substrate 213.

When a desired position of the substrate 101 is irradiated with the multiple beams 20, beams of secondary electrons (multiple secondary electron beams 300) including reflected electrons which correspond to each of the multiple beams 20 are emitted from the substrate 101 due to the irradiation with the multiple beams 20.

The multiple secondary electron beams 300 emitted from the substrate 101 pass through the objective lens 207 and travel to the beam separator 214.

Here, the beam separator 214 generates an electric field and a magnetic field in the directions orthogonal to each other on a plane that is orthogonal to the direction in which a central beam of the multiple beams 20 travels (electron orbit central axis). The electric field exerts a force in the same direction regardless of the traveling direction of electrons. In contrast, the magnetic field exerts a force according to Fleming's left-hand rule. Therefore, it is possible to change the direction of the force acting on the electron depending on the entrance direction of the electron. For the multiple beams 20 entering the beam separator 214 from the upper side, the force by the electric field and the force by the magnetic field cancel each other. The multiple beams 20 travel straight downward. In contrast, for the multiple secondary electron beams 300 entering the beam separator 214 from the lower side, the force by the electric field and the force by the magnetic field act in the same direction. The multiple secondary electron beams 300 are bent obliquely upward and are separated from the multiple beams 20.

The multiple secondary electron beams 300 that have been bent obliquely upward and separated from the multiple beams 20 are further bent by the deflector 218 and are projected onto the multi-detector 222 while being refracted by the electromagnetic lenses 224 and 226. The multi-detector 222 detects the projected multiple secondary electron beams 300. Reflected electrons and secondary electrons may be projected onto the multi-detector 222. Alternatively, the reflected electrons diverge on the way and the remaining secondary electrons may be projected. The multi-detector 222 has, for example, a two-dimensional sensor (not illustrated). Then, each secondary electron of the multiple secondary electron beams 300 collides with a corresponding region of the two-dimensional sensor to generate an electron, and secondary electron image data is generated for each pixel. An intensity signal detected by the multi-detector 222 is output to the detection circuit 106.

Figure 3:
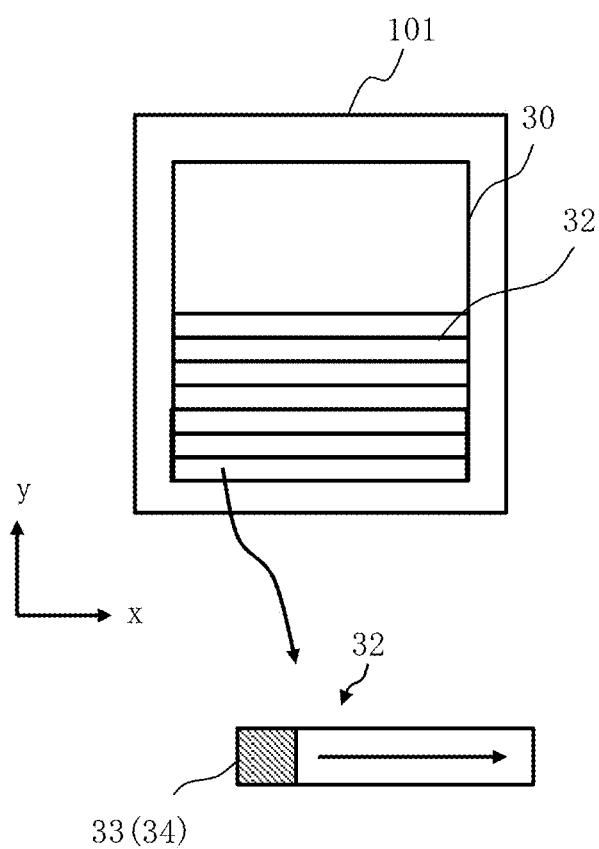
FIG. 3 is a conceptual diagram for describing an example of a scanning operation in Embodiment 1.

FIG. 3 is a conceptual diagram for describing an example of a scanning operation in Embodiment 1. In FIG. 3, for example, an inspection region 30 of the substrate 101 is virtually divided into a plurality of stripe regions 32 with a predetermined width in the y direction. It is preferable that, for example, a mask substrate for exposure is applied as the substrate 101. For example, the inspection region 30 is virtually divided into the plurality of stripe regions 32 with a width that is equal to a natural number multiple of the width of an irradiation region 34 that can be irradiated by one irradiation operation with all of the multiple beams 20. In the example illustrated in FIG. 3, the inspection region 30 is virtually divided into the plurality of stripe regions 32 having the same width as the irradiation region 34. First, the XY stage 105 is moved to adjust a tracking region 33 such that the irradiation region 34 which can be irradiated by one irradiation operation with the multiple beams 20 is located at a position that is outside the first stripe region 32 and is separated from the left end of the first stripe region 32 by, for example, a distance corresponding to the size of one irradiation region 34. Then, the scanning operation is started. In Embodiment 1, for example, the XY stage 105 is continuously moved in the −x direction (an example of a direction opposite to the first direction) at a constant speed and a group of sub-regions disposed at the pitch p in a desired tracking region 33 is scanned while the irradiation region 34 is moved so as to follow the continuous movement. After the scanning operation ends, the irradiation region 34 is moved to the next tracking region 33 in the x direction (an example of the first direction) to perform tracking reset. This operation is repeated to sequentially scan the stripe regions 32 in the x direction. When the first stripe region 32 is scanned, the XY stage 105 is moved, for example, in the −x direction such that the scanning operation is relatively performed in the x direction. When the irradiation of the first stripe region 32 with the multiple beams ends, the position of the stage is moved in the −y direction to adjust the tracking region such that the irradiation region 34 is relatively located in the y direction at a position which is separated from the right end of the second stripe region 32 to the right side by, for example, a distance corresponding to the size of one irradiation region 34. Then, the XY stage 105 is moved, for example, in the x direction, and the multiple beams are similarly emitted in the −x direction. In the third stripe region 32, the multiple beams are emitted in the x direction. In the fourth stripe region 32, the multiple beams are emitted in the −x direction. As such, scanning is performed while alternately changing the direction, which makes it possible to reduce the inspection time. However, the application is not limited to the case in which scanning is performed while alternately changing the direction. For example, when the pattern of each stripe region 32 is written, scanning may be performed in the same direction. The multiple beams 20 formed by passing through each hole 22 of the shaping aperture array substrate 203 make it possible to simultaneously detect the multiple secondary electron beams 300 formed by beams of secondary electrons corresponding to a plurality of beams (primary electron beams) whose maximum number is equal to the number of holes 22.

Figure 4:
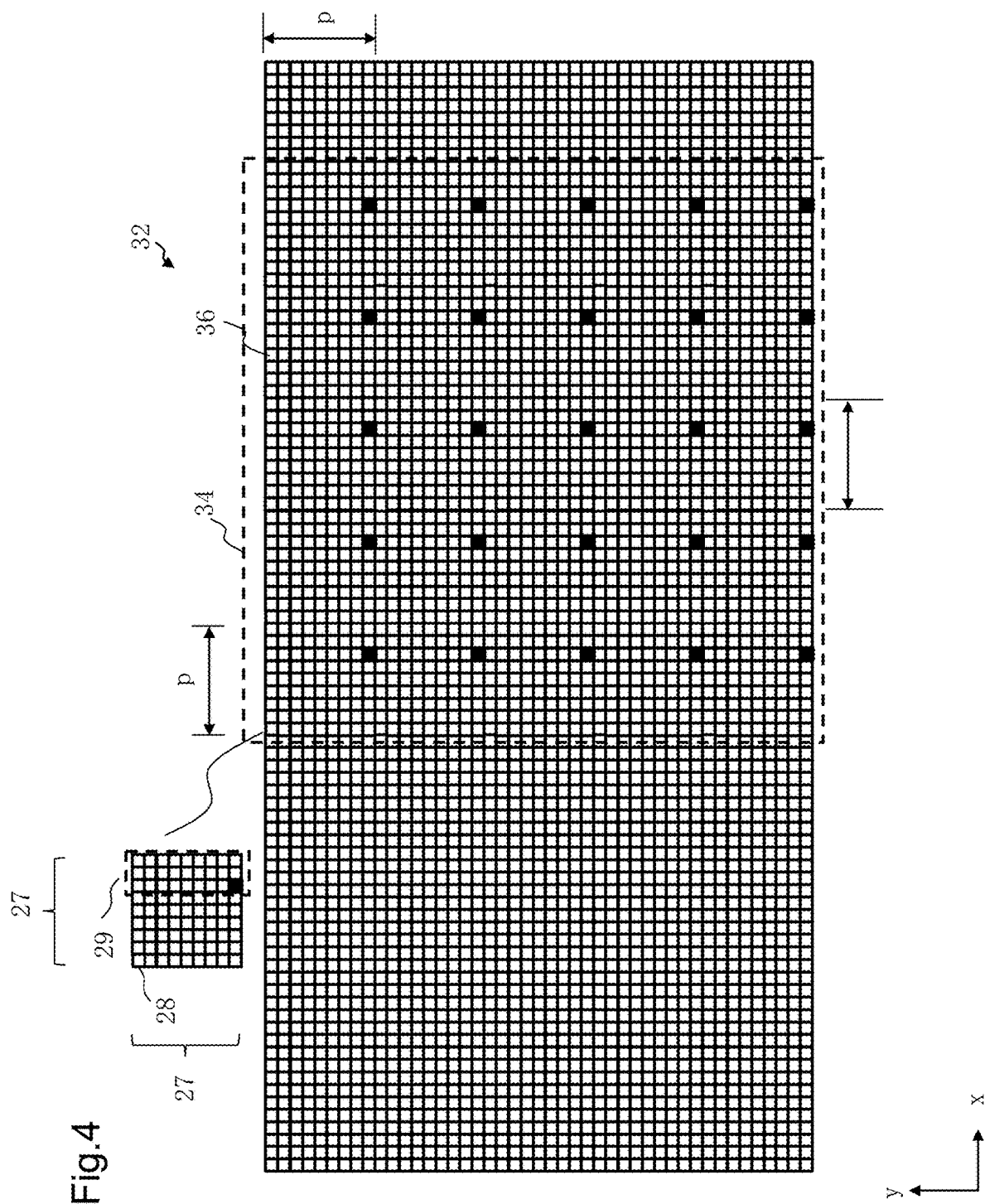
FIG. 4 is a diagram illustrating an example of a region irradiated with multiple beams and a measurement pixel in Embodiment 1.

FIG. 4 is a diagram illustrating an example of a region irradiated with the multiple beams and a measurement pixel in Embodiment 1. In FIG. 4, for example, each stripe region 32 is divided into a plurality of mesh regions with the beam size of the multiple beams. Each mesh region is a measurement pixel 36 (unit irradiation region). A plurality of measurement pixels 28 (beam irradiation positions at the time of one shot which are painted black) that can be irradiated by one irradiation operation with N×N' multiple beams 20 are illustrated in the irradiation region 34. In other words, the pitch p between adjacent measurement pixels 28 in the x direction and the y direction is the pitch between the multiple beams 20 on the substrate 101. In the example illustrated in FIG. 4, one of four adjacent measurement pixels 28 is defined as one of four corners of a rectangle, and one grid 29 (a sub region; a small region) is configured by a rectangular region having a size of p/M in the x direction and a size of p in the −y direction. Here, p/M is obtained by dividing a region (hereinafter, referred to as a p×p region 27) surrounded by p×p pixels in the x direction and the y direction by a division number M (M is an integer equal to or greater than 2) in the x direction, using the measurement pixel 28 as a starting point. In the example illustrated in FIG. 4, a case in which each grid 29 (individual beam scanning region) is composed of 3×9 pixels is illustrated.

Figure 5:
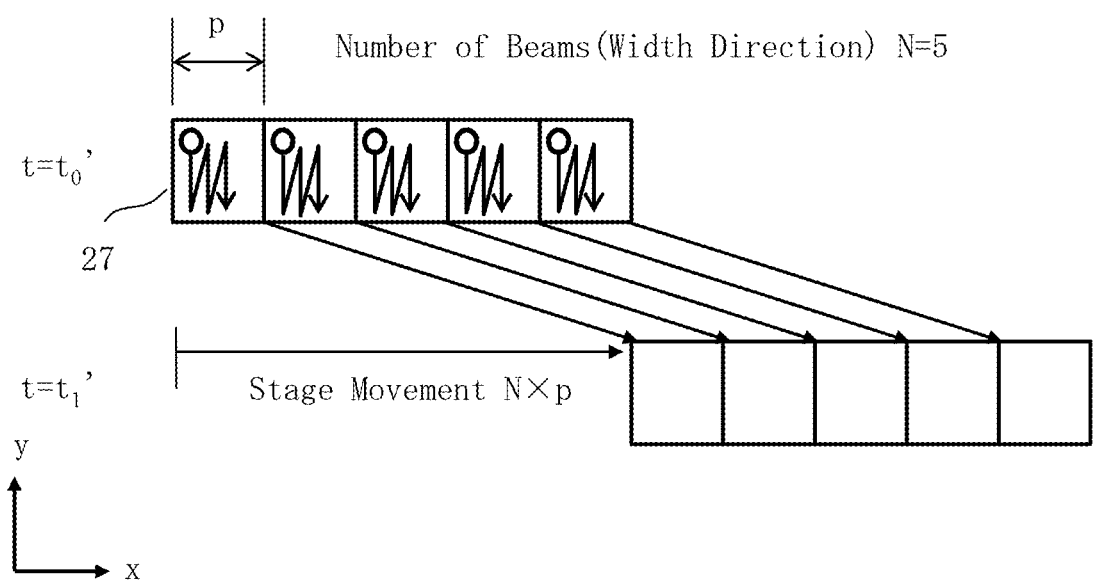
FIG. 5 is a conceptual diagram for describing an example of details of a scanning operation in a comparative example of Embodiment 1.

FIG. 5 is a conceptual diagram for describing an example of the details of a scanning operation in a comparative example of Embodiment 1. In the example illustrated in FIG. 5, as a comparative example of Embodiment 1, among N×N' multiple beams 20, N multiple beams corresponding to one row in the y direction are illustrated. The "row" is the number of grids 29 or p×p regions arranged in the y direction. For example, "one row" indicates that "one grid 29 or one p×p region is arranged in the y direction". Here, N (=5) multiple beams arranged in the x direction at the same pitch p are illustrated. In the comparative example of Embodiment 1, a case in which each of N (=5) multiple beams arranged at the same pitch p in the x direction scans all of the p×p regions 27, each of which is surrounded by p×p pixels in the x direction and the y direction, starting from the corresponding measurement pixel 28, and scans the next p×p regions 27, each of which is surrounded by p×p pixels, is illustrated. In the comparative example of Embodiment 1, the stage speed is controlled such that the XY stage 105 is moved by N·p while each beam scans the region surrounded by p×p pixels (a period from $t=t_0'$ to $t_1'$). At that time, tracking deflection is performed by the deflector 208 such that the region surrounded by p×p pixels can be scanned with each beam by the deflection operation of the deflector 208. Then, tracking reset is performed by collectively deflecting N (=5) multiple beams in the x direction such that the scanning regions do not overlap each other at the time ($t=t_1'$) when the scanning of the N p×p regions 27, each of which is surrounded by p×p pixels and which are arranged consecutively in the x direction, ends. This operation is repeated to scan the regions on the stage that is continuously moved with the multiple beams such that the scanning regions do not overlap each other. In the example illustrated in FIG. 5, it is necessary to deflect the multiple beams in the x direction (or the −x direction) by (N−1)·p (=4p). Therefore, in the comparative example of Embodiment 1, a beam deflection width of (N−1)·p in the x direction (or the −x direction) is needed. In addition, a beam deflection width of p in the y direction (or the −y direction) is needed. As the number of beams N increases, the beam deflection width increases significantly. Therefore, as described above, the influence of the aberration of the electron optics increases.

Figure 6:
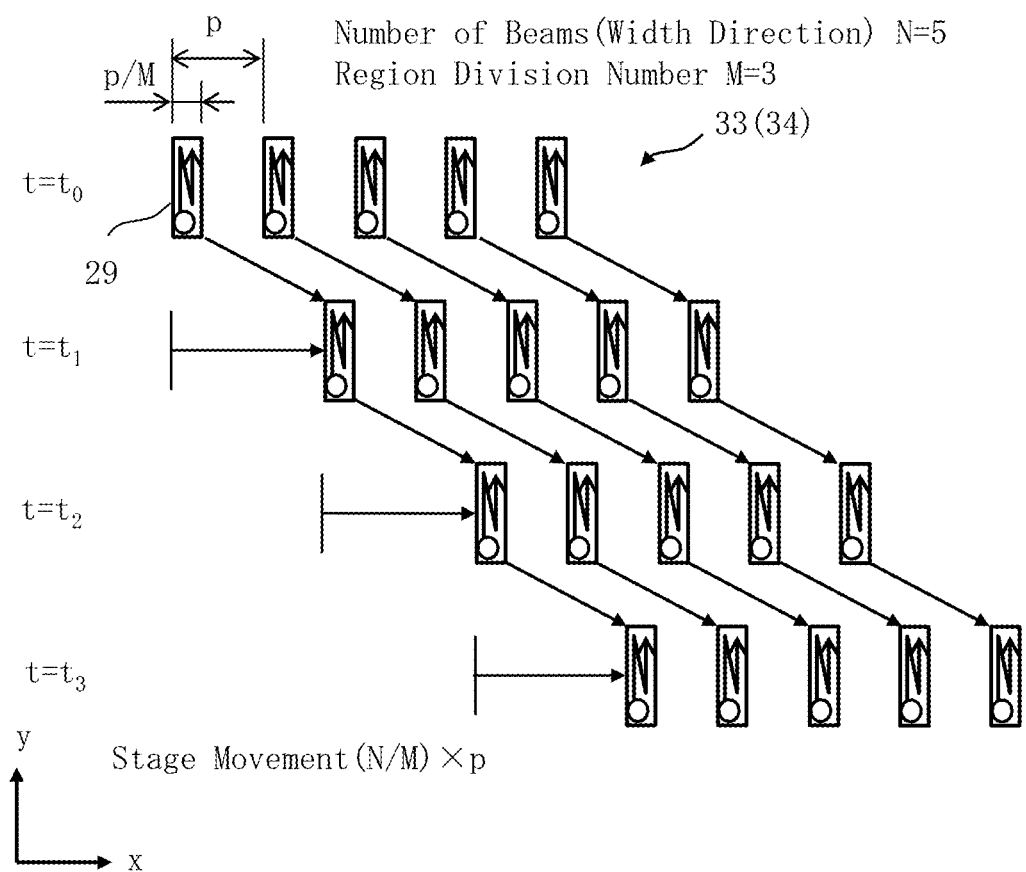
FIG. 6 is a conceptual diagram for describing an example of details of the scanning operation in Embodiment 1.

FIG. 6 is a conceptual diagram for describing an example of the details of the scanning operation in Embodiment 1. In the example illustrated in FIG. 6, as Embodiment 1, among the N×N' multiple beams 20, N multiple beams corresponding to one step in the y direction are illustrated. Here, as in FIG. 5, N (=5) multiple beams arranged in the x direction at the same pitch p are illustrated. In Embodiment 1, one of four adjacent measurement pixels 28 is defined as one of four corners of a rectangle, and the p×p region 27 surrounded by p×p pixels in the x direction and the y direction is divided by the division number M in the x direction, using the measurement pixel 28 as a starting point. Therefore, one grid 29 (a sub-region; a small region) is configured by a rectangular region having a size of p/M in the x direction and a size of p (predetermined size) in the −y direction. In the example illustrated in FIG. 6, a case in which the division number M is 3 is illustrated. In Embodiment 1, a case is illustrated in which each of N (=5) multiple beams arranged in the x direction at the same pitch p scans the grid 29 (sub-regions) having a size of p/M in the x direction and a size (predetermined size) of p in the y direction, starting from the corresponding measurement pixel 28, and then scans the next grid 29 separated by N grids in the x direction.

In FIG. 6, in Embodiment 1, while each beam scans the grid 29 surrounded by (p/M)×p pixels (a period from t=$t_0$ to $t_1$), the XY stage 105 is moved by N/M·p in a case in which the stage speed is the same as that in the comparative example illustrated in FIG. 5. At that time, the deflector 208 performs tracking deflection with the first function, using the N grids 29, which have a size of (p/M)×p and are arranged in the x direction at the pitch p, as the tracking regions 33, such that the grid 29 surrounded by the (p/M)×p pixels can be scanned with each beam by the deflection operation of the deflector 208 using the second function. Then, the deflector 208 collectively deflects N (=5) multiple beams to positions that are separated by N grids 29 in the x direction using the first function such that the scanning regions do not overlap each other at the time (t=$t_1$') when the scanning of the N grids 29, each of which has a size of (p/M)×p and which are arranged in the x direction at the pitch p, is ended by the second function of the deflector 208, thereby performing tracking reset. In the example illustrated in FIG. 6, the deflector 208 collectively deflects five multiple beams to the positions that are separated by five grids 29, using the first function. In this case, it is needless to say that the deflection position by the second function of the deflector 208 is reset from the last pixel 36 to the first pixel 28 in the grid 29. Even in a case in which this operation is repeated for the period from t=$t_1$ to $t_2$, the period t=$t_2$ to $t_3$, . . . to continuously move the stage, it is possible to scan the regions with the multiple beams such that the scanning regions do not overlap each other on the same stripe region 32. In the example illustrated in FIG. 6, it is necessary to deflect the multiple beams in the x direction by (N−1)/M·p (=4p/M). Therefore, in Embodiment 1, it is possible to suppress the beam deflection width in the x direction to (N−1)/M·p. However, when the relationship between the number N of beams and the division number M in the x direction is not controlled, scanning omission (missing teeth) or scanning overlap occurs in the grids 29 (sub-regions). In Embodiment 1, combinations of the values of the number of beams N and the division number M in the x direction are set such that the greatest common divisor of the number of beams N and the division number M in the x direction is 1 in order to apply the scanning method. This condition makes it possible to avoid scanning omission (missing teeth) or scanning overlap.

Figure 7A:
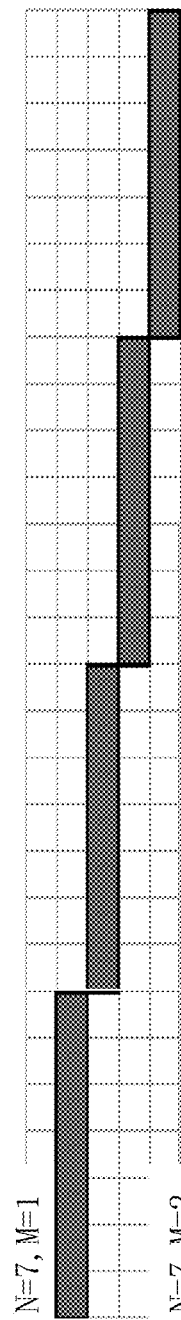
FIGS. 7A to 7F are diagrams illustrating an example of a relationship between the number of beams and a division number in Embodiment 1.
Figure 7B:
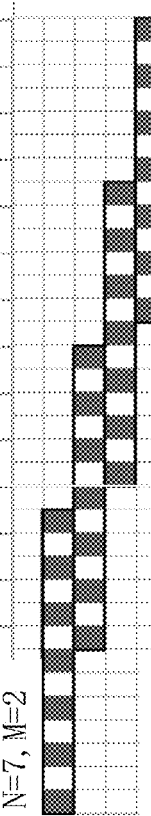
Figure 7C:
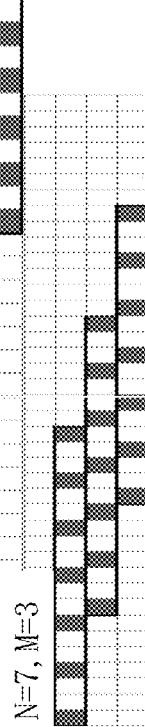
Figure 7D:
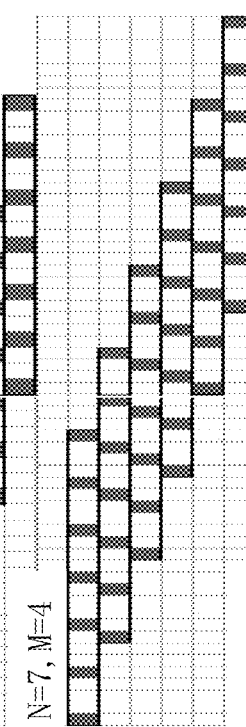
Figure 7E:
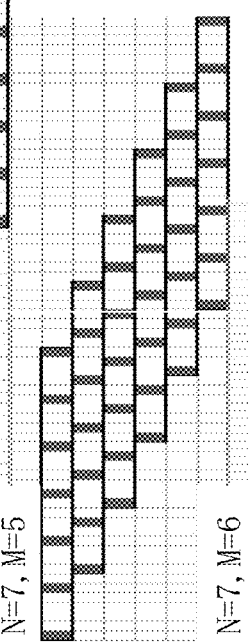
Figure 7F:
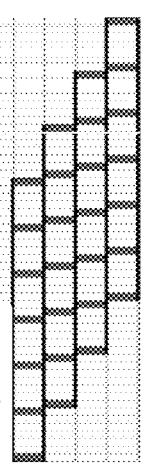

FIGS. 7A to 7F are diagrams illustrating an example of the relationship between the number of beams and the division number in Embodiment 1. FIGS. 7A to 7F illustrate the scanning operation in a case in which N (=7) beams arranged in the x direction are used and the division number M is changed. Further, in FIGS. 7A to 7F, whenever the tracking reset is performed, the beams scan other rows for easy understanding of illustration. Furthermore, in FIGS. 7A to 7F, for convenience, the size of the p×p region 27 surrounded by p×p pixels in the y direction is reduced. FIG. 7A illustrates a case in which the division number M is 1, that is, the p×p region 27 surrounded by p×p pixels is not divided. In FIG. 7A, in a case in which the tracking reset is performed, the beam deflection width has a large value of 6p. FIG. 7B illustrates a case in which the division number M is 2, that is, the p×p region 27 surrounded by p×p pixels is divided into two parts. In FIG. 7B, in a case in which the tracking reset is performed, the beam deflection width can be reduced to 3p. FIG. 7C illustrates a case in which the division number M is 3, that is, the p×p region 27 surrounded by p×p pixels is divided into three parts. In FIG. 7C, in a case in which the tracking reset is performed, the beam deflection width can be reduced to 2p. FIG. 7D illustrates a case in which the division number M is 4, that is, the p×p region 27 surrounded by p×p pixels is divided into four parts. In FIG. 7D, in a case in which the tracking reset is performed, the beam deflection width can be reduced to (3/2)p. FIG. 7E illustrates a case in which the division number M is 5, that is, the p×p region 27 surrounded by p×p pixels is divided into five parts. In FIG. 7E, in a case in which the tracking reset is performed, the beam deflection width can be reduced to (6/5)p. FIG. 7F illustrates a case in which the division number M is 6, that is, the p×p region 27 surrounded by p×p pixels is divided into six parts. In FIG. 7F, in a case in which the tracking reset is performed, the beam deflection width can be reduced to p. As such, the division number M increases to reduce the beam deflection width.

Here, in a case in which a sub-region (grid 29) obtained by dividing the p×p region 27 surrounded by p×p pixels by M is scanned with one beam, when scanning is performed with N multiple beams 20 in the x direction, N sub-regions (grids 29) disposed for every M are simultaneously scanned. Here, it is assumed that a group of M×N consecutive sub-regions (grids 29) is defined as one predetermined range. When the first beam in the x direction among the multiple beams 20 is moved by a distance corresponding to one predetermined range, the sub-region that has not been scanned remains without being scanned. Here, assuming that the number (amount of movement) of skipped sub-regions in the tracking reset is D, M×N/D tracking cycle operations are performed while the first beam in the x direction among the multiple beams 20 is moved by a distance corresponding to one predetermined range. Therefore, in order to scan all of the sub-regions that have been scanned only at a ratio of one to M, without overlap and omission, the division number M needs to be equal to the number of tracking cycle operations, that is, M=M×N/D needs to be established. Therefore, D=N is established. Therefore, in Embodiment 1, the number of skipped sub-regions D in the tracking reset is equal to the number of beams N in the x direction. In addition, the beam deflection width at that time is (N−1)p/M.

In a case in which N sub-regions (grids 29) disposed for every M are scanned at the same time and the number of skipped sub-regions in the tracking reset is N, the following relationship is required in order to prevent the scanning ranges from overlapping each other in one predetermined range:

0, M, 2M, 3M, . . . , (N−1)M, NM
0, N, 2N, 3N, . . . , (M−1)N, MN.

It is necessary to prevent two sequences of numbers from having the same value on the way. Therefore, combinations of the values of the number of beams N in the x direction and the division number M need to be set such that the greatest common divisor of the number of beams N and the division number M is 1 (the number of beams N and the division number M are relatively prime). In the example illustrated in FIGS. 7A to 7F, when the division number M is 7, the two sequences of numbers have the same value on the way. Specifically, when the tracking reset is performed, the sub-region after the movement has already been scanned by an adjacent beam and scanning overlaps, which is NG.

In addition, it is more preferable that a prime number is used as the number of beams N as illustrated in the examples of FIGS. 7A to 7F. The use of the prime number (for example, 2, 3, 5, 7, 11, 13, 17, 23, . . . ) as the number of beams N makes it possible to significantly increase flexibility in the division number M.

Figure 8:
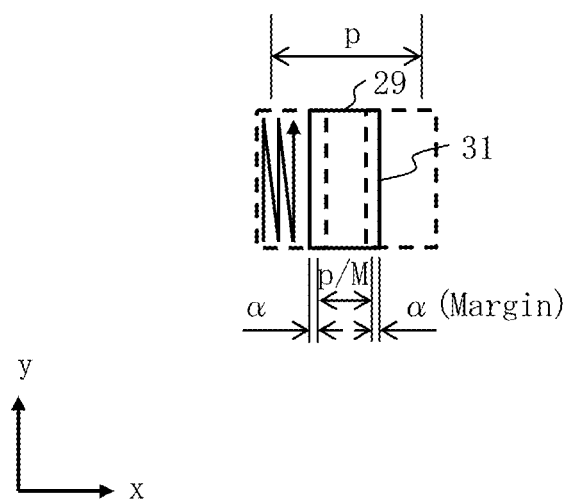
FIG. 8 is a diagram illustrating a relationship between a sub-region and a scanning region in Embodiment 1.

FIG. 8 is a diagram illustrating the relationship between the sub-region 29 and the scanning region in Embodiment 1. FIG. 8 is a diagram illustrating a case in which the region surrounded by a beam pitch p×p is divided into three parts in the x direction. As illustrated in FIG. 8, in a case in which each of the multiple beams 20 scans the corresponding sub-region (grid 29), it is preferable to set each beam scanning region 31 so as to partially overlap adjacent sub-regions (grids 29). The adjacent sub-regions (grids 29) are scanned by different beams among the multiple beams 20. Therefore, the pitch p between the beams deviates from the equal pitch due to the influence of the aberration of the optical system. For this reason, it is preferable to provide a margin width α capable of absorbing the deviation. Therefore, it is preferable that the scanning region 31 in the case of the actual scanning is a region obtained by adding the margin width α to at least one of both ends of the sub-region (grid 29) in the x direction. A scanning end position is moved by the margin width α in the x direction due to the addition of the margin. When the margin width α is provided on both sides, a scanning start position is also moved by the margin width α in the −x direction. FIG. 8 illustrates a case in which the margin width α is added in the x direction. However, it is more preferable to add the margin width α in the y direction as well.

As described in FIGS. 7A to 7F, the division number M increases to reduce the beam deflection width. Therefore, it is desirable to increase the division number from the viewpoint of reducing the beam deflection width. In contrast, when the division number M increases, the number of sub-regions (grids 29) increases. Therefore, the number of overlapping portions increases and useless image data increases. This causes an increase in the amount of data. Therefore, it is desirable to reduce the division number from the viewpoint of reducing the amount of data. Therefore, it is more preferable to select the minimum value of the division numbers M that can obtain the beam deflection width where the influence of the aberration of the electron optics can be ignored.

FIGS. 9A and 9B are diagrams schematically illustrating an example of a scanning operation according to a first aspect of Embodiment 1. The actual scanning is performed by scanning each measurement pixel 28 illustrated in FIG. 4 with the beam. However, here, for the sake of understanding, the scanning operation is schematically illustrated by arrows. In FIGS. 9A and 9B, the x direction which is the right direction of the plane of paper is the first direction, the −x direction which is the left direction of the plane of paper is a direction opposite to the first direction (stage movement direction), the y direction which is the upward direction of the plane of paper is the second direction, and the −y direction which is the downward direction of the plane of paper is a direction opposite to the second direction.

FIG. 9A illustrates a first step of the scanning operation. In the first step, the beam is deflected along the y direction. Here, the deflection of the beam in the first step is performed, using an end portion 29a (for example, the bottom of the end portion 29a) of the grid 29 in the −x direction as a starting point and an end portion 29b (for example, the top of the end portion 29b) of the grid 29 in the x direction as an end point. In addition, the deflection of the beam in the first step is repeatedly performed from the end portion 29a of the grid 29 in the −x direction to the end portion 29b of the grid 29 in the x direction. Therefore, as an example of beam scanning in FIG. 9A, first, the scanning is performed from (1) to (2), is performed from (3) to (4), and is then performed from (5) to (6). For example, the scanning from (1) to (2) is the scanning of the pixels 28 provided in the end portion 29a of the grid 29 in the −x direction. For example, the scanning from (5) to (6) is the scanning of the pixels 28 provided in the end portion 29b of the grid 29 in the x direction. Then, the scanning from (3) to (4) is the scanning of the pixels 28 provided between the end portion 29a of the grid 29 in the −x direction and the end portion 29b of the grid 29 in the x direction. In addition, since the XY stage 105 is continuously moved in the −x direction during a series of scanning operations, the grid 29 is also continuously moved in the −x direction.

FIG. 9B illustrates a second step of the scanning operation. In the second step, the beam is deflected along the −y direction. Here, the deflection of the beam in the second step is performed, using the end portion 29a (for example, the top of the end portion 29a) of the grid 29 in the −x direction as a starting point and the end portion 29b (for example, the bottom of the end portion 29b) of the grid 29 in the x direction as an end point. In addition, the deflection of the beam in the second step is repeatedly performed from the end portion 29a of the grid 29 in the −x direction to the end portion 29b of the grid 29 in the x direction. Therefore, as an example of beam scanning in FIG. 9B, first, the scanning is performed from (19) to (20), is performed from (21) to (22), and is then performed from (23) to (24). For example, the scanning from (19) to (20) is the scanning of the pixels 28 provided in the end portion 29a of the grid 29 in the −x direction. For example, the scanning from (23) to (24) is the scanning of the pixels 28 provided in the end portion 29b of the grid 29 in the x direction. Then, the scanning from (21) to (22) is the scanning of the pixels 28 provided between the end portion 29a of the grid 29 in the −x direction and the end portion 29b of the grid 29 in the x direction. In addition, since the XY stage 105 is continuously moved in the −x direction during a series of scanning operations, the grid 29 is also continuously moved in the −x direction.

The scanning operation is performed by sequentially performing the first step and the second step.

FIGS. 10A and 10B are diagrams schematically illustrating another example of the scanning operation according to the first aspect of Embodiment 1. FIGS. 10A and 10B are different from FIGS. 9A and 9B in that the y direction which is the upward direction of the plane of paper is the direction opposite to the second direction and the −y direction which is the downward direction of the plane of paper is the second direction. Further, FIG. 10A is different from FIG. 9A in that the beam is deflected along the −y direction. In addition, FIG. 10B is different from FIG. 9B in that the beam is deflected along the y direction.

In a case in which a beam scanning time in the y direction or the −y direction including a second beam settling time Ofs_v in the y direction or the −y direction is Tv, a movement speed V of the XY stage 105 is V=PS(M−1)/(2Tv). This is derived as follows. First, the area of the grid 29 that one beam is in charge of is (p/M)×p. Beam scanning is started after the grid 29 with the area (p/M)×p completely enters the p×p region 27 surrounded by p×p pixels in the x direction and the y direction. In order to minimize the influence of the aberration of the beam on the image, it is preferable to complete scanning within the p×p region 27 surrounded by p×p pixels. Then, the movement distance of the XY stage 105 from the start to the end of beam scanning is p−p/M=p(1−1/M). Next, it is assumed that the size of the measurement pixel 28 in the x direction and the y direction is PS and the time required for beam scanning in the y direction is Tv. In this case, the scanning time in the y direction is calculated by (p/(M×PS))×Tv. Then, as illustrated in FIGS. 9A and 9B and FIGS. 10A and 10B, since two scanning operations are performed while changing the polarity in the y direction (the y direction and the −y direction), the following Expression is established: ((p/(M× PS))×Tv×2)×V=p(1−1/M). Therefore, V=PS(M−1)/(2Tv) is established. The above-mentioned movement speed V of the XY stage 105 is calculated by, for example, the movement speed calculation circuit 146.

Then, the beam scanning time Tv in the y direction or the −y direction is as follows: Tv=(p/PS)×(p/M/PS)×(1/f)+(p/ M/PS)×Ofs_v. Here, f is a scanning frequency used for beam scanning. In addition, (P/PS)×(p/M/PS) is the number of measurement pixels 28 in the grid 29. Therefore, (p/PS)× (p/M/PS)×(1/f) is a term corresponding to the time required to irradiate each measurement pixel 28 with the beam in the grid 29. Next, (p/M/PS)×Ofs_v is a term corresponding to the time required to return the beam for scanning in the same direction. Therefore, Tv=(p/PS)×(p/M/PS)×(1/f)+(p/M/ PS)×Ofs_v is derived as the sum of the terms. For example, the scanning frequency is stored in the scanning frequency storage device 141.

FIGS. 11A to 11D are diagrams schematically illustrating an example of a scanning operation according to the second aspect of Embodiment 1. In FIGS. 11A to 11D, the x direction which is the right direction of the plane of paper is the first direction, the −x direction which is the left direction of the plane of paper is the direction (stage movement direction) opposite to the first direction, the y direction which is the upward direction of the plane of paper is the second direction, and the −y direction which is the downward direction of the plane of paper is the direction opposite to the second direction.

FIG. 11A illustrates a first step of the scanning operation. In the first step, the beam is deflected along the y direction. Here, the deflection of the beam in the first step is performed, using the end portion 29a (for example, the bottom of the end portion 29a) of the grid 29 in the −x direction as a starting point and the end portion 29b (for example, the top of the end portion 29b) of the grid 29 in the x direction as an end point. In addition, the deflection of the beam in the first step is repeatedly performed from the end portion 29a of the grid 29 in the −x direction to the end portion 29b of the grid 29 in the x direction. Therefore, as an example of beam scanning in FIG. 11A, first, the scanning is performed from (1) to (2), is performed from (3) to (4), and is then performed from (5) to (6). For example, the scanning from (1) to (2) is the scanning of the pixels 28 provided in the end portion 29a of the grid 29 in the −x direction. For example, the scanning from (5) to (6) is the scanning of the pixels 28 provided in the end portion 29b of the grid 29 in the x direction. Then, the scanning from (3) to (4) is the scanning of the pixels 28 provided between the end portion 29a of the grid 29 in the −x direction and the end portion 29b of the grid 29 in the x direction. In addition, since the XY stage 105 is continuously moved in the −x direction during a series of scanning operations, the grid 29 is also continuously moved in the −x direction.

FIG. 11B illustrates a second step of the scanning operation. In the second step, the beam is deflected along the −x direction. Here, the deflection of the beam in the second step is performed, using an end portion 29c (for example, the right end of the end portion 29c) of the grid 29 in the −y direction as a starting point and an end portion 29d (for example, the left end of the end portion 29d) of the grid 29 in the y direction as an end point. In addition, the deflection of the beam in the second step is repeatedly performed from the end portion 29c of the grid 29 in the −y direction to the end portion 29d of the grid 29 in the y direction. Therefore, as an example of beam scanning in FIG. 11B, first, the scanning is performed from (7) to (8), is performed from (9) to (10), and is then performed from (11) to (12). In addition, since the XY stage 105 is continuously moved in the −x direction during a series of scanning operations, the grid 29 is also continuously moved in the −x direction.

FIG. 11C illustrates a third step of the scanning operation. In the third step, the beam is deflected along the x direction. Here, the deflection of the beam in the third step is performed, using the end portion 29c (for example, the left end of the end portion 29c) of the grid 29 in the −y direction as a starting point and the end portion 29d (for example, the right end of the end portion 29d) of the grid 29 in the y direction as an end point. In addition, the deflection of the beam in the third step is repeatedly performed from the end portion 29d of the grid 29 in the y direction to the end portion 29c of the grid 29 in the −y direction. Therefore, as an example of beam scanning in FIG. 11C, first, the scanning is performed from (13) to (14), is performed from (15) to (16), and is then performed from (17) to (18). In addition, since the XY stage 105 is continuously moved in the −x direction during a series of scanning operations, the grid 29 is also continuously moved in the −x direction.

FIG. 11D illustrates a fourth step of the scanning operation. In the fourth step, the beam is deflected along the −y direction. Here, the deflection of the beam in the fourth step is performed, using the end portion 29a (for example, the top of the end portion 29a) of the grid 29 in the −x direction as a starting point and the end portion 29b (for example, the bottom of the end portion 29b) of the grid 29 in the x direction as an end point. In addition, the deflection of the beam in the fourth step is repeatedly performed from the end portion 29a of the grid 29 in the −x direction to the end portion 29b of the grid 29 in the x direction. Therefore, as an example of beam scanning in FIG. 11D, first, the scanning is performed from (19) to (20), is performed from (21) to (22), and is then performed from (23) to (24). For example, the scanning from (19) to (20) is the scanning of the pixels 28 provided in the end portion 29a of the grid 29 in the −x direction. For example, the scanning from (23) to (24) is the scanning of the pixels 28 provided in the end portion 29b of the grid 29 in the x direction. Then, the scanning from (21) to (22) is the scanning of the pixels 28 provided between the end portion 29a of the grid 29 in the −x direction and the end portion 29b of the grid 29 in the x direction. In addition, since the XY stage 105 is continuously moved in the −x direction during a series of scanning operations, the grid 29 is also continuously moved in the −x direction.

The scanning operation is performed by performing the first step, the second step, the third step, and the fourth step in this order.

FIGS. 12A to 12D are diagrams schematically illustrating another example of the scanning operation according to the second aspect of Embodiment 1. In FIGS. 11B and 11C, the scanning is repeatedly performed from the end portion 29c of the grid 29 in the −y direction to the end portion 29d of the grid 29 in the y direction. In contrast, in FIGS. 12B and 12C, the scanning is repeatedly performed from the end portion 29*d* of the grid 29 in the y direction to the end portion 29*c* of the grid 29 in the −y direction.

FIGS. 13A to 13D are diagrams schematically illustrating still another example of the scanning operation according to the second aspect of Embodiment 1. FIGS. 13A to 13D are different from FIGS. 11A to 11D in that the y direction which is the upward direction of the plane of paper is the direction opposite to the second direction and the −y direction which is the downward direction of the plane of paper is the second direction. In addition, FIG. 13A is different from FIG. 11A in that the beam is deflected along the −y direction. Further, FIG. 13D is different from FIG. 11D in that the beam is deflected along the y direction.

FIGS. 14A to 14D are diagrams schematically illustrating yet another example of the scanning operation according to the second aspect of Embodiment 1. In FIGS. 13B and 13C, the scanning is repeatedly performed from the end portion 29*c* of the grid 29 in the −y direction to the end portion 29*d* of the grid 29 in the y direction. In contrast, in FIGS. 14B and 14C, the scanning is repeatedly performed from the end portion 29*d* of the grid 29 in the y direction to the end portion 29*c* of the grid 29 in the −y direction.

In a case in which a beam scanning time in the x direction or the −x direction including a first beam settling time Ofs_h in the x direction or the −x direction is Th and the beam scanning time in the y direction or the −y direction including the second beam settling time Ofs_v in the y direction or the −y direction is Tv, the movement speed V of the XY stage 105 is $V=PS(M-1)/(2\times(M\times Th+Tv))$. This is derived as follows. First, the area of the grid 29 that one beam is in charge of is $(p/M)\times p$. Beam scanning is started after the grid 29 with the area $(p/M)\times p$ completely enters the p×p region 27 surrounded by p×p pixels in the x direction and the y direction. In order to minimize the influence of the aberration of the beam on the image, it is preferable to complete scanning within the p×p region 27 surrounded by p×p pixels. Then, the movement distance of the XY stage 105 from the start to the end of beam scanning is $p-p/M=p(1-1/M)$. Next, it is assumed that the size of the measurement pixel 28 in the x direction and the y direction is PS, the time required for beam scanning in the x direction is Th, and the time required for beam scanning in the y direction is Tv. In this case, the scanning time in the x direction is calculated by $(p/PS)\times Th$ and the scanning time in the y direction is calculated by $(p/(M\times PS))\times Tv$. Then, as illustrated in FIGS. 11A to 11D to FIGS. 14A to 14D, two scanning operations is performed while changing the polarity in the x direction (the x direction and the −x direction) and two scanning operations is performed while changing the polarity in the y direction (the y direction and the −y direction). Therefore, the following Expression is established: $((p/(M\times PS))\times Tv\times 2+(p/PS)\times Th\times 2)\times V=p(1-1/M)$. Therefore, $V=PS(M-1)/(2\times(M\times Th+Tv))$ is established. The above-mentioned movement speed V of the XY stage 105 is calculated by, for example, the movement speed calculation circuit 146.

Then, the beam scanning time Th in the x direction or the −x direction is as follows: $Th=(p/PS)\times(p/M/PS)\times(1/f)+(p/PS)\times Ofs\_h$. Here, f is a scanning frequency used for beam scanning. In addition, $(p/PS)\times(p/M/PS)$ is the number of measurement pixels 28 in the grid 29. Therefore, $(p/PS)\times(p/M/PS)\times(1/f)$ is a term corresponding to the time required to irradiate each measurement pixel 28 with the beam in the grid 29. Next, $(p/PS)\times Ofs\_h$ is a term corresponding to the time required to return the beam for scanning in the same direction. Therefore, $Th=(p/PS)\times(p/M/PS)\times(1/f)+(p/PS)\times Ofs\_h$ is derived as the sum of the terms. For example, the scanning frequency is stored in the scanning frequency storage device 141.

Similarly, the beam scanning time Tv in the y direction or the −y direction is as follows: $Tv=(p/PS)\times(p/M/PS)\times(1/f)+(p/M/PS)\times Ofs\_v$.

In addition, the first beam settling time Ofs_h and the second beam settling time Ofs_v are stored in the settling time storage device 140. For example, the first beam settling time Ofs_h and the second beam settling time Ofs_v may be input by the operator through the control computer 110 and then stored in the settling time storage device 140. The beam scanning time Th and the beam scanning time Tv are calculated by, for example, the scanning time calculation circuit 148 on the basis of the above-mentioned expression. The calculated beam scanning time Th and beam scanning time Tv may be stored in, for example, the scanning time storage device 149.

FIGS. 15A to 15D are diagrams schematically illustrating an example of a scanning operation according to another comparative example of Embodiment 1.

Figure 15A:
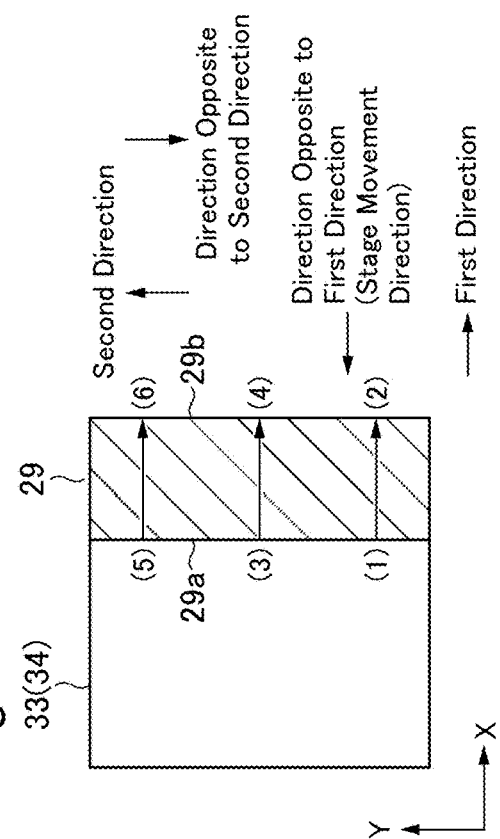
FIGS. 15A to 15D are diagrams schematically illustrating an example of a scanning operation in another comparative example of Embodiment 1.
Figure 15B:
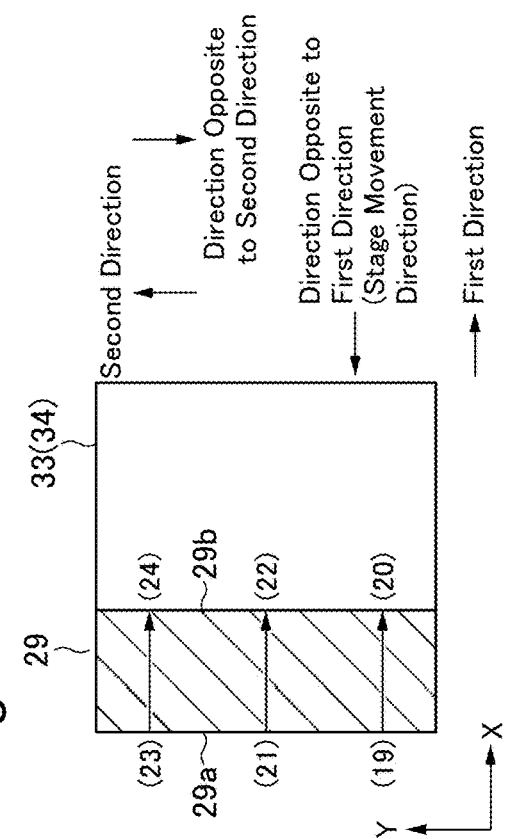

FIG. 15A illustrates, for example, a case in which beam scanning is performed along the −x direction in the first step as illustrated in FIG. 11A. In this case, in particular, in the scanning in the end portion 29*b* of the grid 29 in the x direction as illustrated in (1), (3), and (5) of FIG. 15A, when the grid 29 protrudes from the tracking region 33 in the −x direction corresponding to the movement direction of the XY stage 105, the end portion 29*b* of the grid 29 in the x direction is not irradiated with the beam. Therefore, it is difficult to perform inspection. FIG. 15B illustrates a case in which beam scanning is performed along the x direction. In this case, in particular, in the scanning in the end portion 29*a* of the grid 29 in the −x direction as illustrated in (2), (4), and (6) of FIG. 15B, when the grid 29 protrudes from the tracking region 33 in the −x direction corresponding to the movement direction of the XY stage 105, the end portion 29*a* of the grid 29 in the −x direction is not irradiated with the beam. Therefore, it is difficult to perform inspection. In order to avoid this problem, it is preferable to perform beam scanning along the y direction or the −y direction in the first step.

Figure 15C:
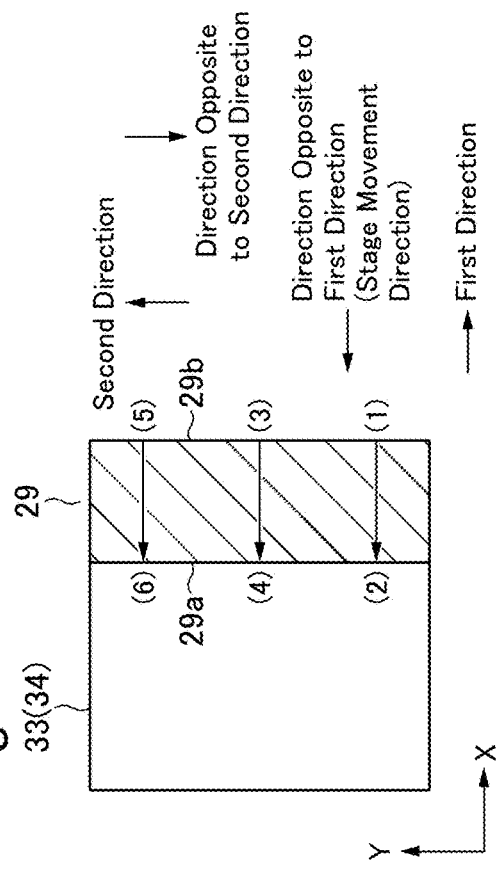
Figure 15D:
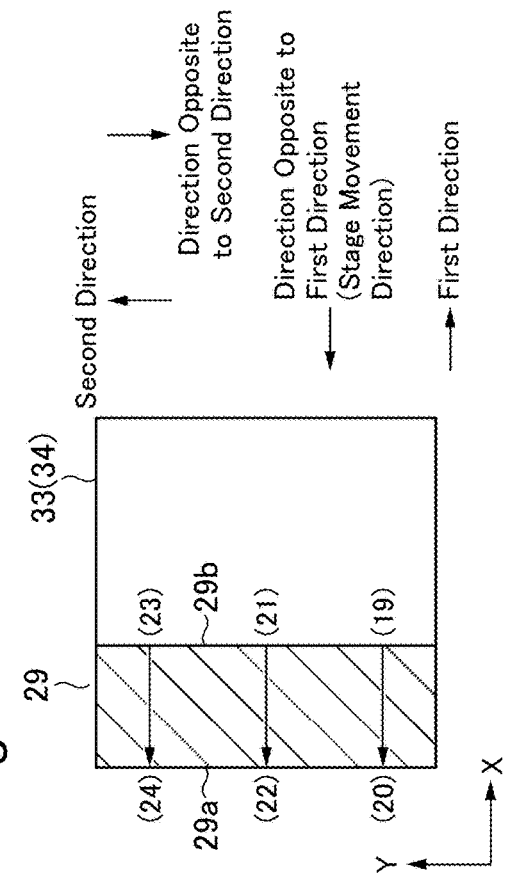

FIG. 15C illustrates, for example, a case in which beam scanning is performed along the −x direction in the fourth step as illustrated in FIG. 11D. In this case, in particular, in the scanning in the end portion 29*a* of the grid 29 in the −x direction as illustrated in (20), (22), and (24), when the grid 29 protrudes from the tracking region 33 in the x direction corresponding to a direction opposite to the movement direction of the XY stage 105, the end portion 29*a* of the grid 29 in the −x direction is not irradiated with the beam. Therefore, it is difficult to perform inspection. FIG. 15D illustrates a case in which beam scanning is performed along the x direction. In this case, in particular, in the scanning in the end portion 29*b* of the grid 29 in the x direction as illustrated in (19), (21), and (23), when the grid 29 protrudes from the tracking region 33 in the x direction corresponding to the direction opposite to the movement direction of the XY stage 105, the end portion 29*b* of the grid 29 in the x direction is not irradiated with the beam. Therefore, it is difficult to perform inspection. In order to avoid this problem, it is preferable to perform beam scanning along the y direction or the −y direction in the fourth step.

From the above, it is preferable that the beam scanning along the x direction or the −x direction is performed in the second step or the third step. It is preferable that the beam scanning along the y direction or the −y direction is performed in the first step or the fourth step.

FIGS. 16A and 16B are diagrams schematically illustrating an example of a scanning operation according to another comparative example of Embodiment 1. In FIG. 16A, for example, beam scanning is performed along the y direction in the first step illustrated in FIG. 11A. However, for example, unlike FIG. 11A, the scanning is performed, using the end portion 29b of the grid 29 in the x direction as a starting point and the end portion 29a of the grid 29 in the −x direction as an end point. In this case, in particular, in the scanning in the end portion 29b of the grid 29 in the x direction as illustrated in (1) and (2) of FIG. 16A, when the grid 29 protrudes from the tracking region 33 in the −x direction corresponding to the movement direction of the XY stage 105, the end portion 29b of the grid 29 in the x direction is not irradiated with the beam. Therefore, it is difficult to perform inspection.

In FIG. 16B, for example, beam scanning is performed along the −y direction in the fourth step illustrated in FIG. 11D. However, for example, unlike FIG. 11D, the scanning is performed, using the end portion 29b of the grid 29 in the x direction as a starting point and the end portion 29a of the grid 29 in the −x direction as an end point. In this case, in particular, in the scanning in the end portion 29a of the grid 29 in the −x direction as illustrated in (23) and (24) of FIG. 16B, when the grid 29 protrudes from the tracking region 33 in the x direction corresponding to the direction opposite to the movement direction of the XY stage 105, the end portion 29a of the grid 29 in the −x direction is not irradiated with the beam. Therefore, it is difficult to perform inspection.

From the above, it is preferable that the beam scanning in the first step is performed, using the end portion 29a of the grid 29 in the −x direction as a starting point and the end portion 29b of the grid 29 in the x direction as an end point. The grid 29 is continuously moved in the −x direction even during the beam scanning. Therefore, in a case in which the beam scanning is performed from the −x direction to the x direction, when the end of the grid 29 in the x direction is scanned, the grid 29 has already been moved to the −x direction. Therefore, in this case, it is less likely that the grid 29 will protrude from the tracking region 33 due to unintended vibration applied to the XY stage 105 and inspection will not be performed.

Similarly, it is preferable that the beam scanning in the fourth step is performed, using the end portion 29a of the grid 29 in the −x direction as a starting point and the end portion 29b of the grid 29 in the x direction as an end point. The grid 29 is continuously moved in the −x direction even during the beam scanning. Therefore, in a case in which the beam scanning is performed from the −x direction to the x direction, when the end of the grid 29 in the −x direction is scanned, the grid 29 is still at a position closer to the x direction. Therefore, in this case, it is less likely that the grid 29 will protrude from the tracking region 33 due to unintended vibration applied to the XY stage 105 and inspection will not be performed.

Figure 17:
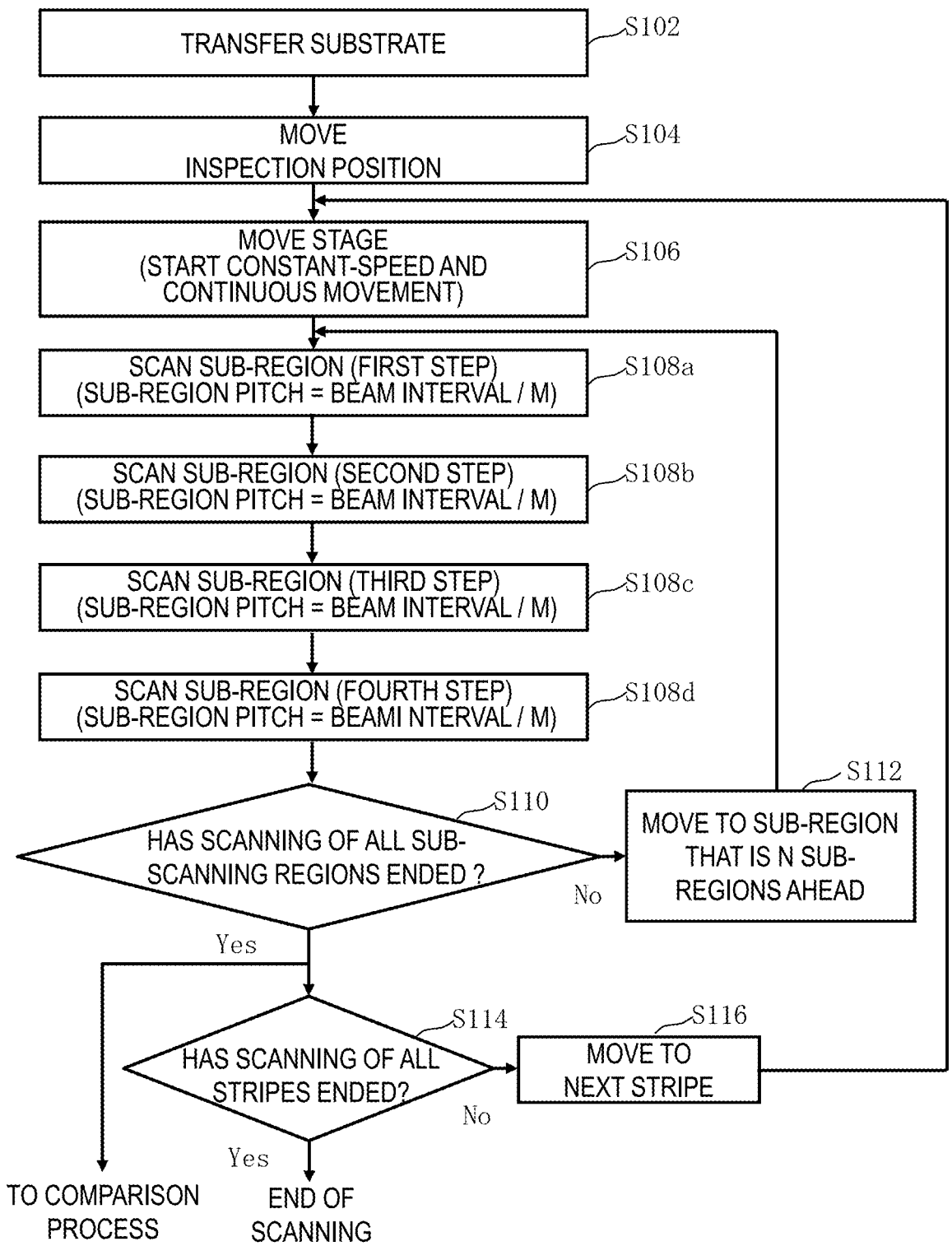
FIG. 17 is a flowchart illustrating some of main steps of an inspection method in Embodiment 1.

FIG. 17 is a flowchart illustrating some of the main steps of an inspection method according to Embodiment 1. FIG. 17 illustrates steps from the start to the end of scanning among the main steps of the inspection method. In FIG. 17, the inspection method according to Embodiment 1 performs a series of steps, such as a substrate transfer step (S102), an inspection position movement step (S104), a stage movement step (start of constant-speed movement) (S106), and a sub-region scanning step (first step) (S108a), a sub-region scanning step (second step) (S108b), a sub-region scanning step (third step) (S108c), a sub-region scanning step (fourth step) (S108d), a determination step (S110), a tracking reset step (S112), a determination step (S114), and a stripe movement step (S116).

In the substrate transfer step (S102), the substrate 101 is transferred into the inspection chamber 103 by a transport mechanism (not illustrated) and is placed on the XY stage 105.

In the inspection position movement step (S104), the driving mechanism 142 moves the XY stage 105 such that the inspection position becomes a position that can be irradiated with the multiple beams 20 under the control of the stage control circuit 114. First, the XY stage 105 is moved such that the irradiation region 34 of the multiple beams 20 is located on the left end side of the stripe region 32 (for example, a position separated from the left end of the stripe region 32 by a distance corresponding to the size of two irradiation regions 34).

In the stage movement step (start of constant-speed and continuous movement) (S106), for example, the driving mechanism 142 moves the XY stage 105 in the −x direction at a constant movement speed V under the control of the stage control circuit 114. Therefore, constant-speed continuous movement is started.

In the aspects illustrated in FIG. 11A to FIG. 14D, in the sub-region scanning step (first step) (S108a), the sub-region scanning step (second step) (S108b), the sub-region scanning step (third step) (S108c), and the sub-region scanning step (fourth step) (S108d), the electron optical image acquisition mechanism 150a scans a plurality of grids 29 (sub-regions; small regions), which are obtained by dividing the stripe region 32 as the inspection region of the substrate 101 and each of which has a size of p/M (M is equal to or greater than 2) in the x direction and a size of p (predetermined size) in the y direction, for each group of N×N' grids 29. Specifically, N×N' multiple beams 20 are collectively deflected to a group of N×N' grids 29 including N grids arranged in the x direction at the pitch p and N' grids arranged in the y direction at the pitch p on the substrate 101 among the plurality of grids 29 and tracking is started. While the XY stage 105 is continuously moved in the −x direction by a distance of N/M·p, the group of N×N' grids 29 is scanned while the tracking deflection of the multiple beams 20 is performed so as to follow the continuous movement of the XY stage 105. Then, a first secondary electron image is acquired in the first step, a second secondary electron image is acquired in the second step, a third secondary electron image is acquired in the third step, and a fourth secondary electron image is acquired in the fourth step. In addition, the average image acquisition circuit 144 is used to acquire an average secondary electron image from the first secondary electron image, the second secondary electron image, the third secondary electron image, and the fourth secondary electron image. The acquired average secondary electron image is stored in, for example, the image storage device 132. In the aspects illustrated in FIGS. 9A and 9B and FIGS. 10A and 10B, the sub-region scanning step (first step) (S108a) and the sub-region scanning step (second step) (S108b) are performed. Then, the first secondary electron image is acquired in the first step and the second secondary electron image is acquired in the second step. Then, the average image acquisition circuit 144 is used to acquire an average secondary electron image from the first secondary electron image and the second secondary electron image.

Figure 18:
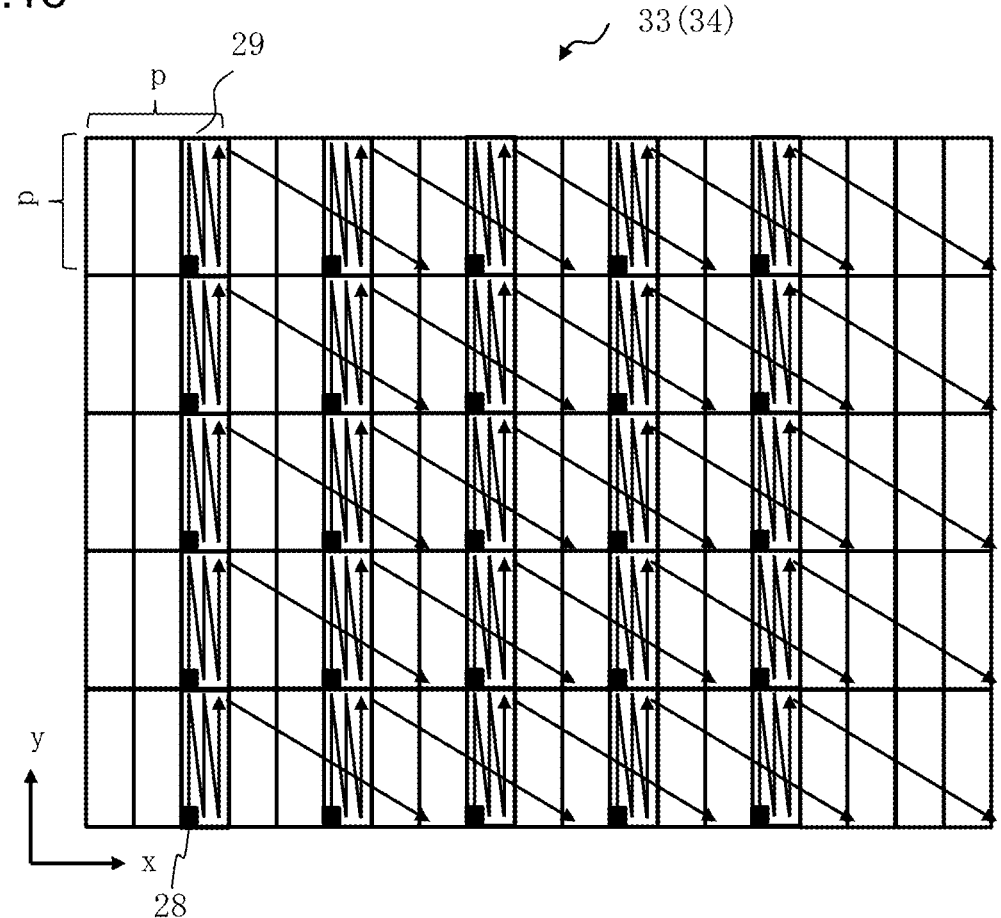
FIG. 18 is a conceptual diagram for describing another example of the details of the scanning operation in Embodiment 1.

FIG. 18 is a conceptual diagram for describing another example of the details of the scanning operation in Embodiment 1. The multiple beams 20 are composed of a plurality of electron beams which are arranged in N columns (N is an integer equal to or greater than 2) at the same pitch p in the x direction (first direction) and are arranged in N' rows (N' is an integer equal to or greater than 1) at the same pitch p in the y direction (second direction) orthogonal to the x direction on the surface of the substrate 101. In the example illustrated in FIG. 18, as the N×N' multiple beams 20, 5×5 multiple beams which are arranged at the same pitch p in the x direction and the y direction on the surface of the substrate 101 are illustrated. The pitch in the y direction may be different from that in the x direction. Among four adjacent measurement pixels 28, one measurement pixel 28 is defined as one of four corners of a rectangle, and the p×p region 27 surrounded by p×p pixels in the x direction and the y direction is divided by the division number M in the x direction, using the measurement pixel 28 as a starting point. Therefore, one grid 29 (a sub-region; a small region) is configured by a rectangular region having a size of p/M in the x direction and a size of p in the −y direction. Therefore, in the example illustrated in FIG. 18, a case in which the division number M is 3 is illustrated. In the example illustrated in FIG. 18, a case is illustrated in which each of the 5×5 multiple beams scans the corresponding grid 29 (sub-region) and then scans the next grid 29 separated by N grids (here, five grids) in the x direction after the scanning.

First, under the control of the deflection control circuit 128, the first function of the deflector 208 collectively deflects the multiple beams 20 to a group of N×N' grids 29 including N grids arranged in the x direction at the pitch p and N' grids arranged in the y direction at the pitch p on the substrate 101 among a plurality of grids 29 which are obtained by dividing the stripe region 32 (inspection region) of the substrate 101 and each of which has a size of p/M (M is an integer equal to or greater than 2) in the x direction and a size of p in the y direction. Here, the beam deflection is performed, using a group of N×N' grids 29, which are arranged in the x direction at the pitch p among the plurality of grids 29 in the irradiation region 34 of the multiple beams 20, as the tracking region 33. The main deflector 208 collectively deflects the multiple beams 20 to a reference position (for example, the center) of the tracking region 33. Then, the main deflector 208 performs the tracking deflection of the multiple beams 20 so as to follow the continuous movement of the XY stage 105.

Under the control of the deflection control circuit 128, the second function of the deflector 208 collectively deflects the multiple beams 20 such that each of the multiple beams 20 is located at the pixel 36, which is the first pixel in the x direction and is the last pixel in the y direction, in the corresponding grid 29. In practice, the multiple beams 20 are collectively deflected such that each beam is located at the pixel 36, which is the first pixel in the x direction and is the top pixel in the y direction, in the scanning region 31 obtained by adding a margin to the corresponding grid 29. Then, the second function collectively deflects the multiple beams 20 so as to scan a group of N×N' grids 29 (specifically, the scanning region 31) set as the tracking region 33 while the tracking deflection of the multiple beams 20 is performed so as to follow the continuous movement of the XY stage 105. Then, at the time of each shot, one measurement pixel 36 corresponding to the same position in the corresponding grid 29 is irradiated with each beam. In the example illustrated in FIG. 18, the first measurement pixel 36 from the left side in the top row in the corresponding grid 29 is irradiated with each beam in the first shot. Then, the deflector 208 collectively shifts the beam deflection positions of all of the multiple beams 20 in the −y direction by a distance corresponding to one measurement pixel 36 such that the first measurement pixel 36 from the left side in the second row from the top in the corresponding grid 29 is irradiated with the beam in the second shot. This scanning operation is repeated to end the irradiation of the first measurement pixel 36 from the left side in the bottom row. Then, the deflector 208 shifts the beam deflection position to the second measurement pixel 36 from the left side in the top row while collectively shifting all of the multiple beams 20 in the x direction by a distance corresponding to one measurement pixel 36. This operation is repeated to sequentially irradiate all of the measurement pixels 36 in one grid 29 with one beam while the XY stage 105 is continuously moved in the −x direction by a distance of N/M·p. This operation is performed with the N×N' multiple beams 20 at the same time. In one shot, the multiple secondary electron beams 300 which are secondary electron beams corresponding to a plurality of shots whose maximum number is equal to the number of holes 22 is detected once by the multiple beams 20 formed by passing through the holes 22 of the shaping aperture array substrate 203. The first function of the deflector 208 deflects the multiple beams 20 (performs a tracking operation) to follow the movement of the XY stage 105 such that the deflection position does not deviate due to the movement of the XY stage 105 until all of the measurement pixels 36 in the grids 29 that the multiple beams 20 are in charge of are scanned.

In the detection step, the multi-detector 222 detects secondary electrons emitted from the substrate 101 due to the irradiation of the substrate 101 with the multiple beams 20. Each beam scans the corresponding grid 29. Each shot of the multiple beams 20 causes secondary electrons to be emitted upward from the irradiated measurement pixels 36. The multi-detector 222 detects the secondary electrons emitted from the substrate 101 due to the irradiation of the substrate 101 with the multiple beams 20. The multi-detector 222 detects the multiple secondary electron beams 300 emitted upward from each measurement pixel 36 for each measurement pixel 36.

In the determination step (S110), when all of the measurement pixels 36 in the grid 29 (specifically, the scanning region 31) that each of the multiple beams 20 is in charge of are scanned with each of the multiple beams 20, the control computer 110 determines whether or not the scanning of all of the grids 29 in the target stripe region 32 has ended. In a case in which the scanning of all of the grids 29 in the target stripe region 32 has ended, the process proceeds to the determination step (S114). In a case in which the scanning of all of the grids 29 in the target stripe region 32 has not ended, the process proceeds to the tracking reset step (S112).

In the tracking reset step (S112), when all of the measurement pixels 36 in the grids 29 (specifically, the scanning region 31) that each of the multiple beams 20 is in charge of are scanned with each of the multiple beams 20 by the deflection operation which is the second function of the deflector 208, the deflector 208 collectively deflects the multiple beams 20 to a new group of N×N' grids 29 (specifically, the scanning region 31) arranged in the x direction at the pitch p, which is separated from the group of N×N' grids 29 by N grids in the x direction, using the first function until the movement of the XY stage 105 in the −x direction by a distance of N/M·p is completed, thereby performing tracking reset.

In the example illustrated in FIG. 18, a new group of N×N' grids 29 (specifically, the scanning region 31) which is separated by 5 grids in the x direction is set as a new tracking region 33. Then, the deflector 208 performs the tracking deflection of the multiple beams 20 so as to follow the continuous movement of the XY stage 105, using the first function. In addition, at the time of the tracking reset, the deflector 208 collectively deflects the multiple beams 20 using the second function such that each of the multiple beams 20 is located at, for example, the pixel 36 which is the first pixel in the x direction and is the last pixel in the y direction in the corresponding grid 29 (specifically, the scanning region 31).

Then, scanning is repeated during a tracking cycle from the tracking start to the tracking reset and tracking. In other words, as described above, the group of the N×N' grids 29 (specifically, the scanning region 31) set as the tracking region 33 is scanned while the tracking deflection of the multiple beams 20 is performed so as to follow the continuous movement of the XY stage 105. This operation can be repeated to scan all of the pixels 36 in the stripe region 32.

In the above description, the shots are divided into the first shot, the second shot, . . . . However, a raster scanning operation may be performed which moves the deflection position while continuously performing irradiation without turning on and off the multiple beams 20 for each pixel 36. Further, the application is not limited to the case in which the pixel columns arranged in the y direction are scanned in the same direction. For example, the first pixel column in the x direction may be scanned in the −y direction and the second pixel column may be scanned in the y direction (opposite direction).

Figure 19:
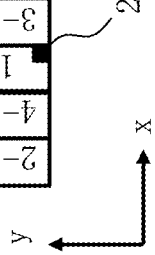
FIG. 19 is a conceptual diagram for describing an example of a relationship between a sub-region and a corresponding beam in the scanning operation in Embodiment 1.

FIG. 19 is a conceptual diagram for describing an example of the relationship between the sub-region and the corresponding beam in the scanning operation in Embodiment 1. In the example illustrated in FIG. 19, a case is illustrated in which 5×5 multiple beams 20 arranged at the same pitch p in the x direction and the y direction are used. In addition, a case in which the division number M is 3 is illustrated. Further, in the example illustrated in FIG. 19, the width (size in the y direction) of the stripe region 32 is divided according to the size of the irradiation region 34. Therefore, the stripe region 32 is divided into a plurality of grids 29 each of which has a size of p/M (=p/3) in the x direction and a size of p in the y direction. In the example illustrated in FIG. 19, the plurality of grids 29 are divided into five rows in the y direction, and a plurality of grids 29 in the x direction in each row are scanned by N (=5) multiple beams 20 in the x direction which are in charge of the same row. As illustrated in FIG. 19, the grids 29 which are scanned by five beams (1 to 5) in each row during an n-th tracking cycle are represented by grids 1-(n), 2-(n), 3-(n), 4-(n), and 5-(n), respectively. When n-th tracking is reset, the deflector 208 deflects the beam to the grid 29 that is N (=5) grids ahead. Therefore, the grid 29 that is five grids ahead is the grid 29 scanned in an (n+1)-th tracking cycle. The grids 29 scanned during the (n+1)-th tracking cycle are represented by 1-(n+1), 2-(n+1), 3-(n+1), 4-(n+1), and 5-(n+1) grids, respectively. The same operation can be repeated to scan all of the grids 29.

For example, the p×p region 27 that is composed of p×p pixels and includes the grid 29 scanned by the first beam in the top row during the n-th tracking cycle includes the remaining two grids 29 among three divided grids. A grid adjacent to (on the right side of) the 1-(n) grid 29 in the x direction is scanned by the third beam during the (n−1)-th tracking cycle. Further, a grid adjacent (on the right side) in the x direction is scanned by the fifth beam during the (n−2)-th tracking cycle. The scanning in the p×p region 27 is completed by the three tracking cycles. This holds for each row in the y direction.

For example, the p×p region 27 that is composed of p×p pixels and includes the grid 29 scanned by the second beam in the top row during the n-th tracking cycle includes the remaining two grids 29 among three divided grids. A grid adjacent to (on the right side of) the 2-(n) grid 29 in the x direction is scanned by the fourth beam during the (n−1)-th tracking cycle. Further, a grid adjacent (on the right side) in the x direction is scanned by the first beam during the (n+1)-th tracking cycle. The scanning in the p×p region 27 is completed by the three tracking cycles. This holds for each row in the y direction.

For example, the p×p region 27 that is composed of p×p pixels and includes the grid 29 scanned by the third beam in the top row during the n-th tracking cycle includes the remaining two grids 29 among three divided grids. A grid adjacent to (on the right side of) the 3-(n) grid 29 in the x direction is scanned by the fifth beam during the (n−1)-th tracking cycle. Further, a grid adjacent (on the right side) in the x direction is scanned by the second beam during the (n+1)-th tracking cycle. The scanning in the p×p region 27 is completed by the three tracking cycles. This holds for each row in the y direction.

For example, the p×p region 27 that is composed of p×p pixels and includes the grid 29 scanned by the fourth beam in the top row during the n-th tracking cycle includes the remaining two grids 29 among three divided grids. A grid adjacent to (on the right side of) the 4-(n) grid 29 in the x direction is scanned by the first beam during the (n+2)-th tracking cycle. Further, a grid adjacent (on the right side) in the x direction is scanned by the third beam during the (n+1)-th tracking cycle. The scanning in the p×p region 27 is completed by the three tracking cycles. This holds for each row in the y direction.

For example, the p×p region 27 that is composed of p×p pixels and includes the grid 29 scanned by the fifth beam in the top row during the n-th tracking cycle includes the remaining two grids 29 among three divided grids. A grid adjacent to (on the right side of) the 5-(n) grid 29 in the x direction is scanned by the second beam during the (n+2)-th tracking cycle. Further, a grid adjacent (on the right side) in the x direction is scanned by the fourth beam during the (n+1)-th tracking cycle. The scanning in the p×p region 27 is completed by the three tracking cycles. This holds for each row in the y direction.

Therefore, in a case in which the division number M is 3 and N (=5) multiple beams are used to scan the stripe region 32, the scanning operation is started from a position where the fifth beam can scan the grid 29 that is outside the scanning-start-side end of the stripe region 32 and is separated by a distance corresponding to at least two tracking cycles from the scanning-start-side end.

This scanning with the multiple beams 20 makes it possible to perform a scanning operation (measurement) at a higher speed than that in a case in which scanning is performed with a single beam.

In the determination step (S114), the control computer 110 determines whether or not the scanning of all of the stripes 32 has ended. In a case in which the scanning of all of the stripes 32 has ended, the electron optical image acquisition process is ended. In a case in which the scanning of all of the stripes 32 has not ended, the process proceeds to the stripe movement step (S116).

In the stripe movement step (S116), under the control of the stage control circuit 114, the driving mechanism 142 moves the XY stage 105 such that the irradiation region 34 of the multiple beams 20 is located on the left end side of the next stripe region 32 (for example, at a position that is separated outward from the left end by a distance corresponding to the size of one irradiation region 34). Then, each of the above steps is repeated.

Figure 20:
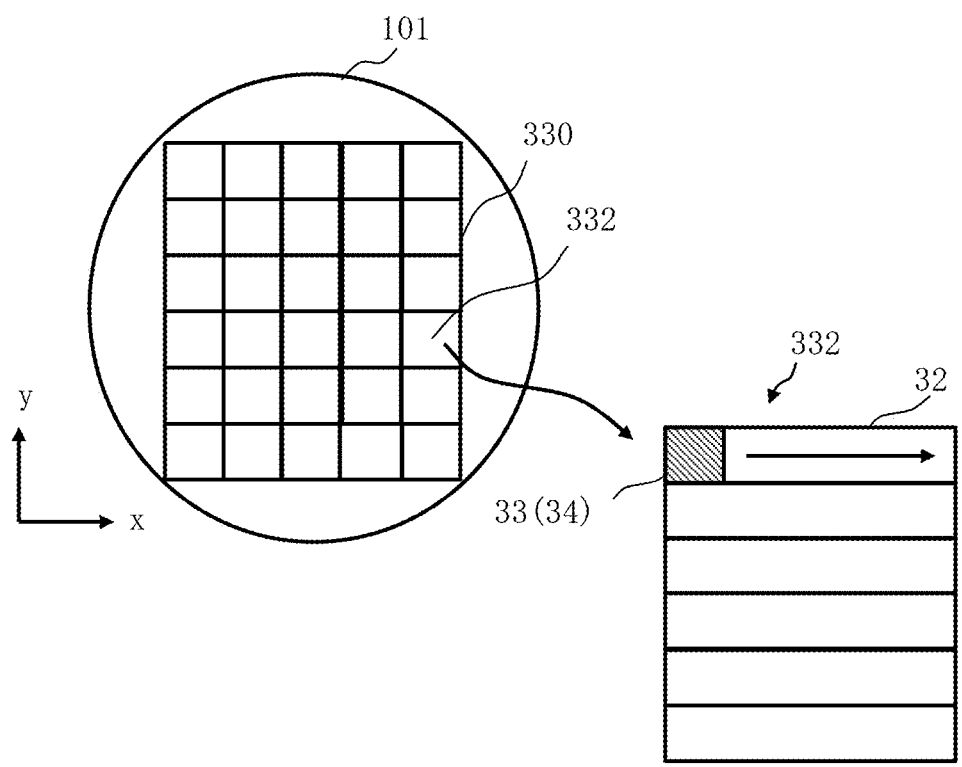
FIG. 20 is a conceptual diagram for describing another example of the scanning operation in Embodiment 1.

FIG. 20 is a conceptual diagram for describing another example of the scanning operation in Embodiment 1. As illustrated in FIG. 20, for example, a plurality of chips 332 (dies) are formed with a predetermined width in an array shape in the x direction and the y direction in an inspection region 330 of the substrate 101. Here, it is preferable that a semiconductor substrate (for example, a wafer) is applied as the substrate 101 to be inspected. For example, each chip 332 with a size of 30 mm×25 mm is formed on the substrate 101. Pattern inspection is performed for each chip 332. For example, a region of each chip 332 is virtually divided into a plurality of stripe regions 32 having the same width in the y direction as the irradiation region 34 that can be irradiated by one irradiation operation with all of the multiple beams 20. The content of the scanning operation on each stripe region 32 may be the same as the above-mentioned content. As described above, in Embodiment 1, each stripe region 32 is scanned by the multiple beams 20 while the XY stage 105 is continuously moved in the −x direction to relatively continuously move the irradiation region 34 in the x direction. When the scanning of all of the stripe regions 32 ends, the position of the stage is moved in the −y direction, and the stripe regions 32 in the next row in the y direction are similarly scanned by the multiple beams 20. This operation is repeated. When the scanning of the region of one chip 332 ends, the XY stage 105 is moved and the scanning operation is similarly performed on the stripe region 32 at the upper end of the next chip 332. This operation is repeated to scan all of the chips 332.

As described above, the electron optical image acquisition mechanism 150a scans the substrate 101, on which a figure pattern is formed, with the multiple beams 20 composed of a plurality of electron beams while continuously moving the XY stage 105 and detects the multiple secondary electron beams 300 emitted from the substrate 101 due to irradiation with the multiple beams 20. A scanning method and a method for detecting the multiple secondary electron beams 300 are as described above. The detection data of the secondary electrons from each measurement pixel 36 detected by the multi-detector 222 is output to the detection circuit 106 in the order of measurement. In the detection circuit 106, analog detection data is converted into digital data by an A/D converter (not illustrated) and is then stored in the stripe pattern memory 123. Then, in a stage in which the detection data of one stripe region 32 (or the chip 332) is accumulated, the detection data is transmitted as stripe pattern data (or chip pattern data) to the comparison circuit 108 together with information indicating each position from the position circuit 107.

A reference image is created in parallel to, before, or after the multiple beams scanning and secondary electron detection step.

In a reference image creation step, in a case in which the substrate 101 is a semiconductor substrate, a reference image creation unit including the pattern generation circuit 111 and the reference circuit 112 creates a reference image of a region corresponding to a measurement image (electron optical image) of a frame region (which will be described below) having a size that is equal to or smaller than the grid 29 composed of a plurality of pixels 36, on the basis of exposure image data in which exposure image on the substrate when a mask pattern of an exposure mask is exposed and transferred to the semiconductor substrate is defined. Instead of the exposure image data, writing data (design data) that is a basis for forming the exposure mask for exposing and transferring a plurality of figure patterns to the substrate 101 may be used. In a case in which the substrate 101 is an exposure mask, the reference image creation unit including the pattern generation circuit 111 and the reference circuit 112 creates a reference image of a region corresponding to a measurement image (electron optical image) of a frame region composed of a plurality of pixels 36, on the basis of writing data (design data) that is a basis for forming a plurality of figure patterns on the substrate 101.

Specifically, the following operation is performed. First, the pattern generation circuit 111 reads writing data (or exposure image data) from the storage device 109 through the control computer 110, converts each figure pattern of each frame region defined by the read writing data (or exposure image data) into binary or multivalued image data, and transmits the image data to the reference circuit 112.

Here, for the figure defined in the writing data (or exposure image data), for example, a rectangle or a triangle is a basic figure. Therefore, for example, the figure data, in which the shape, size, position, and the like of each pattern figure are defined with information including the coordinates (x, y) of the reference position of the figure, the length of the side of the figure, and a figure code which is an identifier for identifying a figure type, such as a rectangle or a triangle, is stored.

When the writing data (or exposure image data) as the figure data is input to the pattern generation circuit 111, the pattern generation circuit 111 expands the writing data to data of each figure and interprets, for example, a figure code and figure dimensions indicating the figure shape of the figure data. Then, the pattern generation circuit 111 expands binary or multivalued design image data as a pattern that is disposed in a square having a grid with predetermined quantization dimensions as a unit and outputs the design image data. In other words, the pattern generation circuit 111 reads design data, calculates the occupation ratio of the figure in the design pattern for each square which is obtained by virtually dividing the inspection region and has a predetermined dimension as a unit, and outputs n-bit occupation ratio data. For example, it is preferable to set one square as one pixel. Then, assuming that one pixel has a resolution of $1/2^8$ ($=1/256$), small regions, each of which has a size of $1/256$ and which correspond to the region of the figure disposed in the pixels, are allocated and the occupation ratio of the figure in the pixels is calculated. Then, the figure image data is output as 8-bit occupation ratio data to the reference circuit 112. The size of the square may be equal to the size of the measurement pixel 36.

Then, the reference circuit 112 performs an appropriate filtering process on the design image data which is the transmitted figure image data. The measurement data as the optical image obtained from the detection circuit 106 is in a state where it has been filtered by the electron optics, that is, in an analog state in which it continuously changes. Therefore, the filtering process can also be performed on design image data which is design-side image data having a digital image intensity value (gray value) to be matched with measurement data. In this way, a design image (reference image) to be compared with the measurement image (optical image) of the frame region is created. The image data of the created reference image is output to the comparison circuit 108. Each reference image output to the comparison circuit 108 is stored in the memory.

Figure 21:
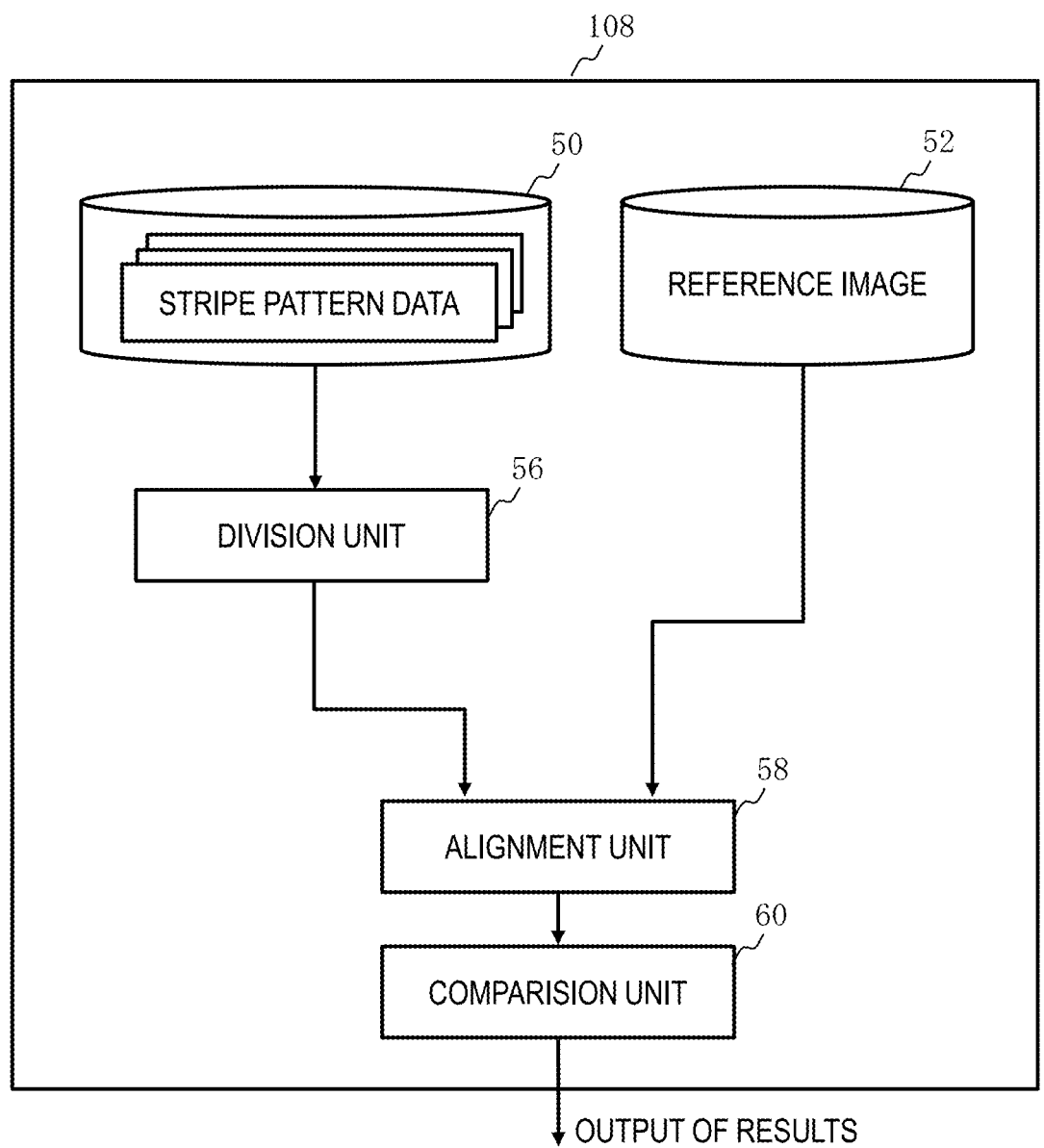
FIG. 21 is a diagram illustrating an internal configuration of a comparison circuit in Embodiment 1.

FIG. 21 is a diagram illustrating the internal configuration of the comparison circuit in Embodiment 1. In FIG. 21, the comparison circuit 108 includes storage devices 50 and 52, such as magnetic disk devices, a division unit 56, an alignment unit 58, and a comparison unit 60. Each of the "~units", such as the division unit 56, the alignment unit 58, and the comparison unit 60, includes a processing circuit. The processing circuit includes, for example, an electric circuit, a computer, a processor, a circuit board, a quantum circuit, or a semiconductor device. In addition, a common processing circuit (the same processing circuit) may be used for each of the "~units". Alternatively, different processing circuits (separate processing circuits) may be used. Input data necessary for the division unit 56, the alignment unit 58, and the comparison unit 60 or the calculated results are stored in a memory (not illustrated) whenever data is input or calculation is performed.

The transmitted stripe pattern data (or chip pattern data) is temporarily stored in the storage device 50 together with the information indicating each position from the position circuit 107. Similarly, the reference image data is temporarily stored in the storage device 52 together with design information indicating each position.

Then, the division unit 56 divides the stripe pattern data (or chip pattern data) for each frame region (unit inspection region) to generate a plurality of frame images (inspection images).

Figure 22:
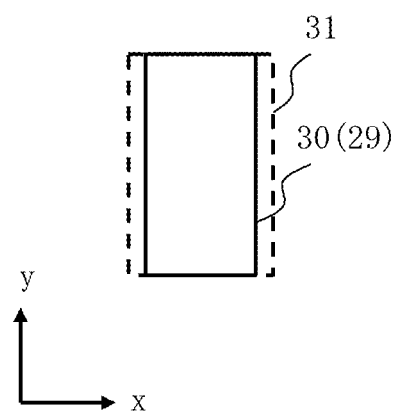
FIG. 22 is a diagram illustrating an example of a relationship between a grid and a frame region in Embodiment 1.

FIG. 22 is a diagram illustrating an example of the relationship between the grid and the frame region in Embodiment 1. As described above, each grid 29 is scanned by one beam. As described above, each grid 29 is scanned in each scanning region 31 larger than the grid 29 such that an error does not occur in a joint with the grid 29 scanned by another beam. Since the characteristics of the obtained secondary electron images are likely to be different from each other for each beam, it is desirable to use an image obtained by one beam as the image of one unit inspection region. Therefore, in Embodiment 1, for each frame region 35 which is a unit inspection region, the measured stripe pattern data (or chip pattern data) is divided to create a plurality of frame images. Similarly, a reference image is created for each frame region 35. In this case, the frame region 35 is set to a range scanned by one beam. Therefore, the frame region 35 is set to a size that is equal to or less than the size of the grid 29. For example, the size of the grid 29 may be set to a natural fraction. As such the division unit 56 divides the detected secondary electron image into inspection images with a size that is equal to or less than the size of the scanning region 31.

Then, the alignment unit 58 aligns the frame image (measurement image) and the reference image in units of sub-pixels smaller than the pixel 36. For example, the least square method may be used for the alignment.

Then, the comparison unit 60 compares the frame image (inspection image) with the reference image corresponding to the frame image (average secondary electron image). For example, the comparison unit 60 compares the frame image and the reference image for each pixel 36. The comparison unit 60 compares the frame image and the reference image for each pixel 36 according to predetermined determination conditions and determines whether or not there is a defect such as a shape defect. For example, when a gradation value difference for each pixel 36 is greater than a determination threshold value, it is determined that there is a defect. Alternatively, the accuracy of inspection may be set to be lower than that of shape defect inspection and the presence or absence of the disconnection or short-circuit of patterns may be inspected. For example, edge pairs of the pattern are detected and the distance between the edge pairs is measured. Therefore, it is possible to measure the width of a line pattern and the distance of a space portion between the line patterns. Similarly, when a difference from the distance obtained from the reference image is greater than a determination threshold value, it is determined that there is a defect. The distance between a plurality of edge pairs in a line direction can be measured to inspect the presence or absence of the disconnection and/or short-circuit of the patterns. Then, the comparison result is output. The comparison result may be output from the storage device 109, the monitor 117, the memory 118, or the printer 119.

As described above, according to Embodiment 1, it is possible to reduce the beam deflection width in the pattern inspection that is performed using the multiple beams 20 composed of a plurality of beams arranged in the movement direction of the XY stage 105 while continuously moving the XY stage 105. Therefore, it is possible to suppress the influence of the aberration of the optical system. Furthermore, the use of the multiple beams 20 makes it possible to improve throughput in the pattern inspection.

FIG. 23 is a diagram illustrating another configuration of the pattern inspection apparatus according to Embodiment 1. The electron optical image acquisition mechanism 150a illustrated in FIG. 1 includes the deflector 208. In contrast, an electron optical image acquisition mechanism 150b illustrated in FIG. 23 includes a main deflector 208 and a sub-deflector 209. For example, the main deflector 208 is in charge of the first function, and the sub-deflector 209 is in charge of the second function.

For example, the inspection apparatus having the configuration illustrated in FIG. 23 includes: a movable stage, a substrate being placed on the movable stage; a stage control circuit continuously moving the stage in a direction opposite to a first direction; a first deflector (main deflector 208) that collectively deflects multiple beams composed of a plurality of charged particle beams, which are arranged in N columns (N is an integer equal to or greater than 2) and N' rows (N' is an integer equal to or greater than 1) in the first direction and a second direction orthogonal to the first direction at the same pitch p on a surface of the substrate, to an N×N' small region group including N small regions arranged at the pitch p in the first direction and N' small regions arranged at the pitch p in the second direction on the substrate among a plurality of small regions which are obtained by dividing an inspection region of the substrate and each of which has a size of p/M (M is an integer equal to or greater than 2) in the first direction and a predetermined size in the second direction, performs tracking deflection of the multiple beams so as to follow the continuous movement of the stage while the stage is continuously moved by a distance of N/M·p in the direction opposite to the first direction, and collectively deflects the multiple beams to a new group of the N×N' small regions arranged at the pitch p in the first direction to perform tracking reset until the movement of the stage by the distance of N/M·p in the direction opposite to the first direction is completed, the new N×N' small region group being away from the N×N' small region group by N small regions in the first direction; a second deflector (sub-deflector 209) that performs sequentially performing a first step, a second step, a third step, and a fourth step in each of the small regions with each of the multiple beams while the tracking deflection of the multiple beams is performed so as to follow the continuous movement of the stage to collectively deflect the multiple beams so as to scan the N×N' small region group, the first step repeating the collective deflection of the multiple beams along the second direction from an end of each of the small regions in the direction opposite to the first direction to an end of each of the small regions in the first direction, using the end of each of the small regions in the direction opposite to the first direction as a starting point and the end of each of the small regions in the first direction as an end point, the second step repeating the collective deflection of the multiple beams along the direction opposite to the first direction, the third step repeating the collective deflection of the multiple beams along the first direction, the fourth step repeating the collective deflection of the multiple beams along a direction opposite to the second direction from the end of each of the small regions in the direction opposite to the first direction to the end of each of the small regions in the first direction, using the end of each of the small regions in the direction opposite to the first direction as a starting point and the end of each of the small regions in the first direction as an end point; and a detector detecting a secondary electron emitted from the substrate due to irradiation of the substrate with the multiple beams. Combinations of a value of N and a value of M are set such that the greatest common divisor of the value of N and the value of M is 1.

In the above description, a series of "~circuits" includes a processing circuit, and the processing circuit includes, for example, an electric circuit, a computer, a processor, a circuit board, a quantum circuit, or a semiconductor device. Further, a common processing circuit (the same processing circuit) may be used for each of "~circuits". Alternatively, different processing circuits (separate processing circuits) may be used. A program that causes, for example, the processor to be executed may be recorded on a recording medium, such as a magnetic disk device, a magnetic tape device, an FD, or a read only memory (ROM). Furthermore, a series of "storage devices" in this embodiment is, for example, a magnetic disk device, a magnetic tape device, an FD, a ROM, or a flash memory.

The embodiments have been described above with reference to the specific examples. However, the application is not limited to these specific examples. In the above-mentioned examples, the case in which the XY stage 105 is continuously moved at a constant speed has been described. However, the application is not limited to the case. For ease of control, constant-speed continuous movement is desirable. However, continuous movement with acceleration or deceleration may be performed. Further, any magnitude relationship may be established between the number of beams N and the division number M in the continuous movement direction (the −x direction in the embodiment) of the XY stage 105 during scanning as long as the least common divisor of the two values is 1.

Further, beam irradiation may be performed in any order in a case in which the inside of the grid 29 (scanning region 31) is scanned. However, since the deflector 208 collectively deflects all of the multiple beams 20, beam irradiation may be performed in the same order between the grids 29.

In addition, in the above-mentioned examples, the case in which the beams are arranged in an orthogonal lattice shape has been described. However, the application is not limited to the case. For example, the beams may be arranged in a diagonal grid shape. Alternatively, the beam rows arranged in the x direction may be disposed such that the beams in the rows adjacent to each other in the y direction slightly deviate from each other in the x direction. For example, the first beams in the beam rows arranged in the x direction may be unevenly disposed.

Furthermore, the shape of the grid 29 (a sub-region; a small region) is not limited to a rectangular shape. The grids 29 may have other shapes as long as they are disposed at a pitch of p/M in the x direction and are disposed at an equal pitch in the y direction. The shape of the grid 29 (a sub-region; a small region) may be, for example, a parallelogram. In this case, the scanning region 31 may be set to a parallelogram according to the shape of the grid 29. In the case of the parallelogram, since the circuit pattern has many horizontal and/or orthogonal lines in the x direction, oblique scanning with the beams makes is easy to avoid scanning in parallel to the circuit pattern and the influence of charging is avoided.

Further, for the array pitch of the multiple beams 20, the multiple beams 20 may be arranged at different pitches in the x direction and the y direction. For example, the multiple beams 20 may be arranged at an equal pitch p in the x direction and at an equal pitch p' in the y direction.

For example, the description of portions, such as a device configuration and a control method that are not directly necessary for the description of the application, is omitted. However, required device configurations and control methods may be appropriately selected and used.

In addition, all of the electron beam inspection apparatuses and the electron beam inspection methods that include the elements of the application and can be appropriately modified by those skilled in the art are included in the scope of the application.

What is claimed is:

1. A charged particle beam inspection apparatus comprising:
a movable stage, configured to hold a substrate placed on the movable stage;
a stage control circuit, configured to continuously move the movable stage in a direction opposite to a first direction;
a deflection control circuit, configured to control a deflector to
collectively deflect multiple beams to an N×N' small region group including N small regions (N being an integer equal to or greater than 2) arranged at a pitch p in the first direction and N' small regions (N' being an integer equal to or greater than 1) arranged at the pitch p in a second direction orthogonal to the first direction on the substrate among a plurality of small regions obtained by dividing an inspection region of the substrate, each small region having a size of p/M (M being an integer equal to or greater than 2) in the first direction and a predetermined size in the second direction, the multiple beams being composed of a plurality of charged particle beams arranged in N columns and N' rows in the first direction and the second direction at the same pitch p on a surface of the substrate, the collective deflection comprising
performing tracking deflection of the multiple beams so as to follow a continuous movement of the movable stage by a distance of N/Mp in the direction opposite to the first direction, and
collectively deflecting the multiple beams to a new group of N×N' small regions arranged at the pitch p in the first direction to perform a tracking reset until the continuous movement of the movable stage by the distance of N/M·p in the direction opposite to the first direction is completed, the new N×N' small region group being located away from the N×N' small region group by N small regions in the first direction, and
sequentially perform a first step and a second step in each of the small regions with each of the multiple beams while the tracking deflection of the multiple beams is performed so as to follow the continuous movement of the movable stage to collectively deflect the multiple beams so as to scan the N×N' small region group, the first step comprising repeating the collective deflection of the multiple beams along the second direction from an end of each of the small regions in the direction opposite to the first direction to an end of each of the small regions in the first direction, using the end of each of the small regions in the direction opposite to the first direction as a starting point and the end of each of the small regions in the first direction as an end point, and the second step comprising repeating the collective deflection of the multiple beams along a direction opposite to the second direction from the end of each of the small regions in the direction opposite to the first direction to the end of each of the small regions in the first direction, using the end of each of the small regions in the direction opposite to the first direction as a starting point and the end of each of the small regions in the first direction as an end point; and a detector configured to detect secondary electrons emitted from the substrate due to irradiation of the substrate with the multiple beams, wherein combinations of a value of N and a value of M are set such that the greatest common divisor of the value of N and the value of M is 1.

2. The charged particle beam inspection apparatus according to claim 1, wherein, when a measurement pixel size irradiatable with the charged particle beam is PS and a beam scanning time in the second direction or the direction opposite to the second direction is Tv, the beam scanning time Tv including a second beam settling time Ofs_v in the second direction or the direction opposite to the second direction, a movement speed V of the movable stage is $V=PS(M-1)/(2Tv)$.

3. The charged particle beam inspection apparatus according to claim 1, wherein, when a measurement pixel size irradiatable with the charged particle beam is PS, a scanning frequency of the charged particle beam is f and a second beam settling time in the second direction or the direction opposite to the second direction is Ofs_v, a beam scanning time Tv in the second direction or the direction opposite to the second direction is $Tv=(p/PS)\times(p/M/PS)\times(1/f)+(p/M/PS)\times Ofs\_v$.

4. The charged particle beam inspection apparatus according to claim 1, further comprising:

an average image acquisition circuit configured to acquire an average secondary electron image obtained by averaging a first secondary electron image acquired in the first step and a second secondary electron image acquired in the second step.

5. A charged particle beam inspection apparatus comprising:

a movable stage, configured to hold a substrate placed on the movable stage;

a stage control circuit, configured to continuously move the movable stage in a direction opposite to a first direction;

a deflection control circuit, configured to control a deflector to collectively deflect multiple beams to an N×N' small region group including N small regions (N being an integer equal to or greater than 2) arranged at a pitch p in the first direction and N' small regions (N' being an integer equal to or greater than 1) arranged at the pitch p in a second direction orthogonal to the first direction on the substrate among a plurality of small regions obtained by dividing an inspection region of the substrate, each small region having a size of p/M (M being an integer equal to or greater than 2) in the first direction and a predetermined size in the second direction, the multiple beams being composed of a plurality of charged particle beams arranged in N columns and N' rows in the first direction and the second direction at the same pitch p on a surface of the substrate, the collective deflection comprising performing tracking deflection of the multiple beams so as to follow a continuous movement of the movable stage by a distance of N/M·p in the direction opposite to the first direction, and collectively deflecting the multiple beams to a new group of N×N' small regions arranged at the pitch p in the first direction to perform a tracking reset until the continuous movement of the movable stage by the distance of N/M·p in the direction opposite to the first direction is completed, the new N×N' small region group being located away from the N×N' small region group by N small regions in the first direction, and sequentially perform a first step, a second step, a third step, and a fourth step in each of the small regions with each of the multiple beams while the tracking deflection of the multiple beams is performed so as to follow the continuous movement of the movable stage to collectively deflect the multiple beams so as to scan the N×N' small region group, the first step comprising repeating the collective deflection of the multiple beams along the second direction from an end of each of the small regions in the direction opposite to the first direction to an end of each of the small regions in the first direction, using the end of each of the small regions in the direction opposite to the first direction as a starting point and the end of each of the small regions in the first direction as an end point, the second step comprising repeating the collective deflection of the multiple beams along the direction opposite to the first direction, the third step comprising repeating the collective deflection of the multiple beams along the first direction, and the fourth step comprising repeating the collective deflection of the multiple beams along a direction opposite to the second direction from the end of each of the small regions in the direction opposite to the first direction to the end of each of the small regions in the first direction, using the end of each of the small regions in the direction opposite to the first direction as a starting point and the end of each of the small regions in the first direction as an end point; and a detector configured to detect secondary electrons emitted from the substrate due to irradiation of the substrate with the multiple beams, wherein combinations of a value of N and a value of M are set such that the greatest common divisor of the value of N and the value of M is 1.

6. The charged particle beam inspection apparatus according to claim 5,
wherein the collective deflection of the multiple beams in the second step is repeated from the direction opposite to the second direction to the second direction.

7. The charged particle beam inspection apparatus according to claim 5,
wherein the collective deflection of the multiple beams in the second step is repeated from the second direction to the direction opposite to the second direction.

8. The charged particle beam inspection apparatus according to claim 5,
wherein, when a measurement pixel size irradiatable with the charged particle beam is PS, a beam scanning time in the first direction or the direction opposite to the first direction is Th, the beam scanning time Th including a first beam settling time Ofs_h in the first direction or the direction opposite to the first direction, and a beam scanning time in the second direction or the direction opposite to the second direction is Tv, the beam scanning time Tv including a second beam settling time Ofs_v in the second direction or the direction opposite to the second direction, a movement speed V of the movable stage is $$V=PS(M-1)/(2\times(M\times Th+Tv)).$$

9. The charged particle beam inspection apparatus according to claim 5,
wherein, when a measurement pixel size irradiatable with the charged particle beam is PS, a scanning frequency of the charged particle beam is f, a first beam settling time in the first direction or the direction opposite to the first direction is Ofs_h and a second beam settling time in the second direction or the direction opposite to the second direction is Ofs_v, a beam scanning time Th in the first direction or the direction opposite to the first direction is $$Th=(p/PS)\times(p/M/PS)\times(1/f)+(p/PS)\times Ofs\_h$$

and a beam scanning time Tv in the second direction or the direction opposite to the second direction is $$Tv=(p/PS)\times(p/M/PS)\times(1/f)+(p/M/PS)\times Ofs\_v.$$

10. The charged particle beam inspection apparatus according to claim 5, further comprising:
an average image acquisition circuit configured to acquire an average secondary electron image obtained by averaging a first secondary electron image acquired in the first step, a second secondary electron image acquired in the second step, a third secondary electron image acquired in the third step, and a fourth secondary electron image acquired in the fourth step.

11. A charged particle beam inspection method comprising:
collectively deflecting multiple beams to an N×N' small region group including N small regions (N being an integer equal to or greater than 2) arranged at a pitch p in a first direction and N' small regions (N' being an integer equal to or greater than 1) arranged at the pitch p in a second direction orthogonal to the first direction on a substrate among a plurality of small regions obtained by dividing an inspection region of the substrate, each small region having a size of p/M (M being an integer equal to or greater than 2) in the first direction and a predetermined size in the second direction, the multiple beams being composed of a plurality of charged particle beams arranged in N columns and N' rows in the first direction and the second direction at the same pitch p on a surface of the substrate;
sequentially performing a first step and a second step in each of the small regions with each of the multiple beams while performing the tracking deflection of the multiple beams so as to follow continuous movement of a movable stage by a distance of N/M·p in a direction opposite to the first direction, the substrate being placed on the movable stage,
the first step comprising repeating the collective deflection of the multiple beams along the second direction from an end of each of the small regions in the direction opposite to the first direction to an end of each of the small regions in the first direction, using the end of each of the small regions in the direction opposite to the first direction as a starting point and the end of each of the small regions in the first direction as an end point, and
the second step comprising repeating the collective deflection of the multiple beams along a direction opposite to the second direction from the end of each of the small regions in the direction opposite to the first direction to the end of each of the small regions in the first direction, using the end of each of the small regions in the direction opposite to the first direction as a starting point and the end of each of the small regions in the first direction as an end point;
detecting secondary electrons emitted from the substrate due to irradiation of the substrate with the multiple beams; and
collectively deflecting the multiple beams to a new group of the N×N' small regions arranged at the pitch p in the first direction to perform tracking reset until the movement of the movable stage by the distance of N/M·p in the direction opposite to the first direction is completed, the new N×N' small region group being located away from the N×N' small region group by N small regions in the first direction,
wherein combinations of a value of N and a value of M are set such that the greatest common divisor of the value of N and the value of M is 1.

12. The charged particle beam inspection method according to claim 11,
wherein, when a measurement pixel size irradiatable with the charged particle beam is PS and a beam scanning time in the second direction or the direction opposite to the second direction is Tv, a movement speed V of the movable stage is $$V=PS(M-1)/(2Tv).$$

13. The charged particle beam inspection method according to claim 11,
wherein, when a measurement pixel size irradiatable with the charged particle beam is PS, a scanning frequency of the charged particle beam is f and a second beam settling time in the second direction or the direction opposite to the second direction is Ofs_v, a beam scanning time Tv in the second direction or the direction opposite to the second direction is $$Tv=(p/PS)\times(p/M/PS)\times(1/f)+(p/M/PS)\times Ofs\_v.$$

14. The charged particle beam inspection method according to claim 11, further comprising:

acquiring an average secondary electron image obtained by averaging a first secondary electron image acquired in the first step and a second secondary electron image acquired in the second step.

15. A charged particle beam inspection method comprising:

collectively deflecting multiple beams to an N×N' small region group including N small regions (N being an integer equal to or greater than 2) arranged at a pitch p in a first direction and N' small regions (N' being an integer equal to or greater than 1) arranged at the pitch p in a second direction orthogonal to the first direction on a substrate among a plurality of small regions obtained by dividing an inspection region of the substrate, each small region having a size of p/M (M being an integer equal to or greater than 2) in the first direction and a predetermined size in the second direction, the multiple beams being composed of a plurality of charged particle beams arranged in N columns and N' rows in the first direction and the second direction at the same pitch p on a surface of the substrate;

sequentially performing a first step, a second step, a third step, and a fourth step in each of the small regions with each of the multiple beams while performing the tracking deflection of the multiple beams so as to follow continuous movement of a movable stage by a distance of N/M·p in a direction opposite to the first direction, the substrate being placed on the movable stage, the first step comprising repeating the collective deflecting of the multiple beams along the second direction from an end of each of the small regions in the direction opposite to the first direction to an end of each of the small regions in the first direction, using the end of each of the small regions in the direction opposite to the first direction as a starting point and the end of each of the small regions in the first direction as an end point, the second step comprising repeating the collective deflection of the multiple beams along the direction opposite to the first direction, the third step comprising repeating the collective deflection of the multiple beams along the first direction, and the fourth step comprising repeating the collective deflection of the multiple beams along a direction opposite to the second direction from the end of each of the small regions in the direction opposite to the first direction to the end of each of the small regions in the first direction, using the end of each of the small regions in the direction opposite to the first direction as a starting point and the end of each of the small regions in the first direction as an end point;

detecting secondary electrons emitted from the substrate due to irradiation of the substrate with the multiple beams; and collectively deflecting the multiple beams to a new group of the N×N' small regions arranged at the pitch p in the first direction to perform tracking reset until the movement of the movable stage by the distance of N/M·p in the direction opposite to the first direction is completed, the new N×N' small region group being away from the N×N' small region group by N small regions in the first direction, wherein combinations of a value of N and a value of M are set such that the greatest common divisor of the value of N and the value of M is 1.

16. The charged particle beam inspection method according to claim 15, wherein the collective deflection of the multiple beams in the second step is repeated from the direction opposite to the second direction to the second direction.

17. The charged particle beam inspection method according to claim 15, wherein the collective deflection of the multiple beams in the second step is repeated from the second direction to the direction opposite to the second direction.

18. The charged particle beam inspection method according to claim 15, wherein, when a measurement pixel size irradiatable with the charged particle beam is PS, a beam scanning time in the first direction or the direction opposite to the first direction is Th and a beam scanning time in the second direction or the direction opposite to the second direction is Tv, a movement speed V of the movable stage is $$V=PS(M-1)/(2\times(M\times Th+Tv)).$$

19. The charged particle beam inspection method according to claim 15, wherein, when a measurement pixel size irradiatable with the charged particle beam is PS, a scanning frequency of the charged particle beam is f, a first beam settling time in the first direction or the direction opposite to the first direction is Ofs_h and a second beam settling time in the second direction or the direction opposite to the second direction is Ofs_v, a beam scanning time Th in the first direction or the direction opposite to the first direction is $$Th=(p/PS)\times(p/M/PS)\times(1/f)+(p/PS)\times Ofs\_h$$

and a beam scanning time Tv in the second direction or the direction opposite to the second direction is $$Tv=(p/PS)\times(p/M/PS)\times(1/f)+(p/M/PS)\times Ofs\_v.$$

20. The charged particle beam inspection method according to claim 15, further comprising:

acquiring an average secondary electron image obtained by averaging a first secondary electron image acquired in the first step, a second secondary electron image acquired in the second step, a third secondary electron image acquired in the third step, and a fourth secondary electron image acquired in the fourth step.

* * * * *